United States Patent [19]

Nakagawa et al.

[11] Patent Number: 5,028,488

[45] Date of Patent: Jul. 2, 1991

[54] FUNCTIONAL $ZNSE_{1-x}TE_x:H$ DEPOSITED FILM

[75] Inventors: Katsumi Nakagawa, Nagahama; Shunichi Ishihara, Hikone; Masahiro Kanai, Tokyo; Tsutomu Murakami, Nagahama; Kozo Arao, Hikone; Yasushi Fujioka, Sakai; Akira, both of Nagahama, all of Japan

[73] Assignee: Canon Kabushiki Kaisha, Tokyo, Japan

[21] Appl. No.: 226,819

[22] Filed: Aug. 1, 1988

[30] Foreign Application Priority Data

Jul. 31, 1987 [JP] Japan ................................ 62-190405

[51] Int. Cl.$^5$ ............................................. B32B 15/04
[52] U.S. Cl. .................................... 428/457; 428/689; 428/697
[58] Field of Search ............... 428/457, 658, 697, 689; 136/249, 264; 437/2, 4, 105, 111; 252/501.1; 204/86; 514/223.5

[56] References Cited

U.S. PATENT DOCUMENTS

| | | | |
|---|---|---|---|
| 4,217,347 | 8/1980 | Horovitz et al. | 514/223.5 |
| 4,217,374 | 8/1980 | Ovshinsky et al. | 427/39 |
| 4,226,898 | 10/1980 | Ovshinsky et al. | 437/2 X |
| 4,242,374 | 12/1980 | Sanpregret | 437/2 X |
| 4,345,107 | 8/1982 | Fulop et al. | 204/86 X |
| 4,445,965 | 5/1984 | Milnes | 437/111 |
| 4,447,335 | 5/1984 | Loeffler et al. | 252/501.1 |
| 4,451,691 | 5/1984 | Fraas | 136/249 |
| 4,482,780 | 11/1984 | Mitchell | 437/4 X |
| 4,575,577 | 3/1986 | Fraas | 437/2 X |
| 4,851,302 | 7/1989 | Nakagawa et al. | 428/658 |

FOREIGN PATENT DOCUMENTS 61-189649  8/1986  Japan.
61-189650  8/1986  Japan.

Primary Examiner—Thomas J. Herbert
Attorney, Agent, or Firm—Fitzpatrick, Cella, Harper & Scinto

[57] ABSTRACT

A functional $ZnSe_{1-x}Te_x:H$ film having a high doping efficiency and with no substantial change in the characteristics upon light irradiation. Said film is characterized in that the Se/Te quantitative ratio is in the range from 3:7 to 1:9 by the atom number ratio, hydrogen atoms are contained in an amount of 1 to 4 atomic % and the ratio of the crystal grain domains per unit volume is in the range from 65 to 85% by volume. There are also provided improved p-type and n-type $ZnSe_{1-x}Te_x:H:M$ films (M stands for a dopant) of high electroconductivity characterized in the foregoing way.

These deposited films may be efficiently deposited even on a non-single crystal substrate made of metal, glass or synthetic resin with a high deposition rate.

These films are suited for the preparation of a high functional device such as a photovoltaic element.

4 Claims, 15 Drawing Sheets

FIG. 1
(A)
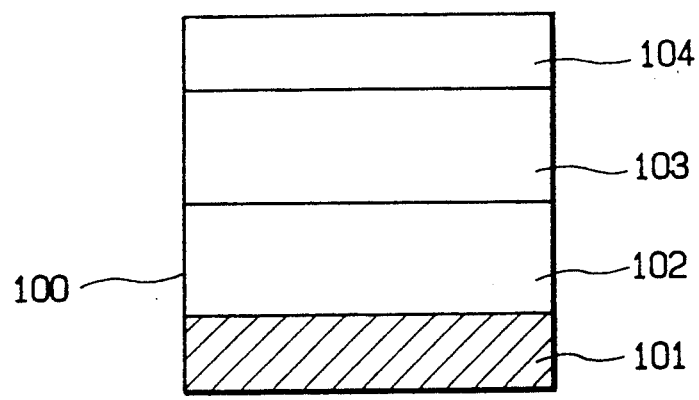
(B)
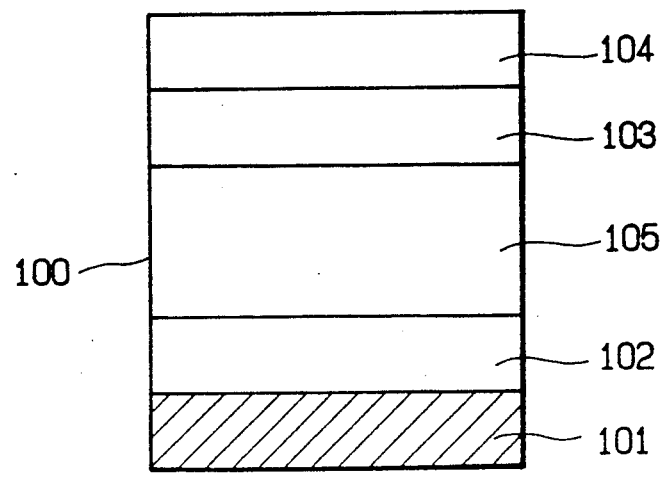

(When the hydrogen(H) content is 2 atomic %)

FUNCTIONAL ZNSE$_{1-x}$TE$_x$:H DEPOSITED FILM

FIELD OF THE INVENTION

The present invention concerns a functional deposited film comprising Zn atoms, selenium atoms, tellurium atoms and at least hydrogen atoms. More specifically, it concerns an improved functional deposited film having p conduction type particularly which is suitable for use not only in solar cell but also in other devices.

BACKGROUND OF THE INVENTION

There have been proposed a variety of photovoltaic elements for solar cell and for power source in electric appliances. Those photovoltaic elements utilize pn junctions formed by way of ion implantation or thermal diffusion of an impurity into a single crystal substrate such as silicon (Si) or gallium arsenide (GaAs) or by way of epitaxial growth of an impurity-doped layer on such a single crystal substrate. However, there is a disadvantage to any of such known photovoltaic elements since there is used such single crystal substrate as described above, their production cost is inevitably increased and they have not yet come into use generally as solar cell or as power source in electric appliances.

Incidentally, a photovoltaic element utilizing a pin junction comprising an amorphous silicon (hereinafter referred to as "A-Si") film deposited on a substrate of an inexpensive commercially available non-single crystal material such as glass, metal, ceramics and synthetic resin has been proposed in recent years. This photovoltaic element is satisfactory to some extent and it can be prepared at a low cost. In view of this, it has been recognized to be usable as the power source for limited kinds of domestic equipment such as electronic pocket computers and wrist watches. However, for this photovoltaic element, since the band gap in the A-Si film constituting the photovoltaic element is not sufficiently great being of about 1.7 eV, it involves problems that the output voltage is low and no sufficient optoelectronic conversion efficiency can be obtained, this is particularly so, for the light source in which light at short wavelength is predominant, for example, fluorescent lamp and because of this, its application is limited only to appliances with very small power consumption.

There is a further disadvantage for said photovoltaic element that the constituent A-Si film is often accompanied with the so-called Staebler-Wronsk effect, in which the film being deteriorated upon continuous irradiation with intense light over a long period of time.

In view of the above, the photovoltaic element described above can not be put to practical use as the power solar cell requiring to maintain stable characteristics over a long period of time.

Meanwhile, there have been proposed direct transition-type semiconductor films having a wide band gap, such as ZnSe (having a band gap of 2.67 eV) and ZnTe (having a band gap of 2.26 eV) and mixed crystal thereof ZnSe$_{1-x}$Te$_x$ (where $0<x<1$). Public attention has been focused on these semiconductor films. These semiconductor films are, in general, such that are formed on a substrate of single crystal by way of epitaxial growth. The as-grown film of ZnSe exhibits the n-type conductivity and the as-grown film of ZnTe exhibits the p-type conductivity. However for any of these films, it is generally recognized that it is difficult for the film to be controlled to the opposite conduction type. Further, in order to carry out the epitaxial growth upon the film formation, it is required to use a specific substrate of single crystal and to maintain the substrate at elevated temperature. And in this film formation, the deposition rate is low. Because of this, it is impossible to perform epitaxial growth on a commercially available substrate which is inexpensive and low heat-resistant such as glass and synthetic resin. These factors make it difficult to develop practically applicable semiconductors films using the foregoing commercially available substrates.

Even in the case where a semiconductor film should be fortunately formed on such commercially available substrate, the film will be such that is usable only in very limited applications.

In fact, there have been various proposals to form a direct transition-type semiconductor film on a non-single crystal substrate such as glass, metal, ceramics and synthetic resin. However, under any of such proposals, it is difficult to obtain a desired direct transition-type semiconductor film having satisfactory electrical characteristics because the resulting film is accompanied with defects of various kinds which make the film poor in electrical characteristics and because of this, it is difficult for the film to be controlled by doping it with an impurity.

By the way, proposals for amorphous films constituted with Zn, Se, Te elements can be seen in the literature. As such literature, there can be mentioned U.S. Pat. No. 4217374 (hereinafter referred to as "literature 1") and U.S. Pat. No. 4226898 (hereinafter referred to as "literature 2"). Furthermore, ZnSe compound or ZnTe compound is described in Japanese Patent Laid-Open No. Sho 61-189649 (hereinafter referred to as "literature 3") and Japanese Patent Laid-Open No. Sho 61-189650 (hereinafter referred to as "literature 4"). Although the literature 1 mentions an amorphous semiconductor film containing selenium (Se), tellurium (Te), zinc (Zn), hydrogen (H) and lithium (Li), it mainly describes amorphous Se semiconductor film or amorphous Te semiconductor film, in which Zn is stated only as an additive similar to Li and H. As for the Zn and the Li, they are incorporated in order to reduce the localized level density in the energy gap without changing the inherent nature of the film similar to the case of the H. In other words, the additions of Zn and Se in the literature 1 are not intended to positively form a ZnSe compound. In fact, the literature 1 mentions nothing at all about the formation of a ZnSe compound, ZnTe compound or ZnSe$_{1-x}$Te$_x$ compound and likewise, nothing at all about the formation of ZnSe crystal grains, ZnTe crystal grains and ZnSe$_{1-x}$Te$_x$ crystal grains. In addition, Li is not added as the dopant.

Although the literature 2 describes an amorphous semiconductor film containing Se, Te, Zn and H, the description in the literature 2 mainly concerns amorphous Si, and the Se and the Te are described as forming compounds therewith, while the Zn is described as the element for sensitizing the photoconductivity and reducing the localized level density in the energy gap of the amorphous semiconductor film. That is, Zn, Se and Te are added not for forming a ZnSe compound, ZnTe compound or ZnSe$_{1-x}$Te$_x$ compound. The literature 2 mentions nothing at all about the formation of a ZnSe compound, ZnTe compound or ZnSe$_{1-x}$Te$_x$ compound and likewise, nothing at all about the formation of ZnSe crystal grains, ZnTe crystal grains and ZnSe$_{1-x}$Te$_x$ grains.

Literatures 3 and 4 are of the contents of improving the productivity of ZnSe and ZnTe films upon forming them by deposition through the hydrogen radical assisted CVD method (HR-CVD method) by increasing the film depositing rate, but they merely disclose the deposited films constituted with non-doped ZnSe and ZnTe.

Against these backgrounds, there is an increased social demand to provide an inexpensive photovoltaic element having a high photoelectric conversion efficiency, particularly, for short-wavelength light which may be practically usable as solar cell and also as a power source in various electric appliances.

SUMMARY OF THE INVENTION

The present invention is aimed at solving the aforementioned problems relating to photovoltaic elements for use in solar cell and other appliances and satisfying the foregoing social demand.

It is therefore an object of the present invention is to provide a functional deposited film containing zinc atoms, selenium atoms and tellurium atoms as the main constituents, and at least hydrogen atoms which excellent in quality and which can be formed even on a commercially available non-single crystal substrate of glass, metal, ceramics or synthetic resin.

Another object of the present invention is to provide said functional deposited film the conductivity of which may be stably and easily controlled by doping with a proper impurity and which is highly sensitive to the doping.

A further object of the present invention is to provide the foregoing functional deposited film which enables one to produce a desirable photovoltaic element having an improved photoelectric conversion efficiency which is suited for use in solar cell and in other appliances.

BRIEF DESCRIPTION OF THE DRAWINGS

FIG. 1 is a schematic view for a typical embodiment of the layer structure in which functional deposited films according to the present invention are used for a photovoltatic device;

DETAILED DESCRIPTION OF THE INVENTION

The present inventors have made extensive studies for overcoming the foregoing problems on the known $ZnSe_{1-x}Te_x$ film for use in various photovoltaic elements such as solar cell and attaining the objects as described above and as a result, have accomplished the present invention based on the findings as below described.

That is, as a result that there was prepared a $ZnSe_{1-x}Te_x$ deposited amorphous film in which the quantitative ratio of Se to Te and the content of hydrogen atoms (H) being specified and the proportion of crystal grains per unit volume being controlled to a specific value (this deposited film is hereinafter referred to as "$ZnSe_{1-x}Te_x$:H film"), the present inventors have found that (a) the $ZnSe_{1-x}Te_x$:H film may be formed in a desired state even on a non-single crystal substrate of glass, metal, ceramics or synthetic resin: (b) the foregoing film formed on such non-single crystal substrate is one that has extremely few defects: (c) the foregoing film can be easily and efficiently doped with a dopant of p-type or n-type: and (d) when doped with a p-type dopant, the foregoing film undergoes a desirable p-type semiconductor film.

The present invention has been completed on the basis of these findings. The gist of the present invention therefore resides in a functional deposited film comprising zinc atoms, selenium atoms and tellurium atoms as the main constituents, and at least hydrogen atoms, characterized in that the quantitative ratio of the selenium atoms to the tellurium atoms is in the range from 1:9 to 3:7 by the atom number ratio, the content of the hydrogen atoms is in the range from 1 to 4 atomic % and the proportion of crystal grain domains per unit volume is in the range from 65 to 85 vol %.

The experiments which were carried out by the present inventors to obtain the foregoing findings will be explained in the following.

EXPERIMENTS

A: Observations on the ratio of crystal grain domain formed in $ZnSe_{1-x}Te_x$ film in a case where hydrogen is introduced (1) Preparation of specimen (i) There were provided two kinds of substrates, i.e. a substrate prepared by thermally oxidizing a disk-like p-type Si single crystal wafer of low resistivity (resistivity=$10^{-1}$ cm) with 0.5 mm thickness and 1 inch diameter thereby forming a $SiO_2$ film of about 500 Å thereon in a $CO_2$ gas stream at 1000° C., and a quartz glass substrate of 2.5 $cm^2$ square.

Figure 2:
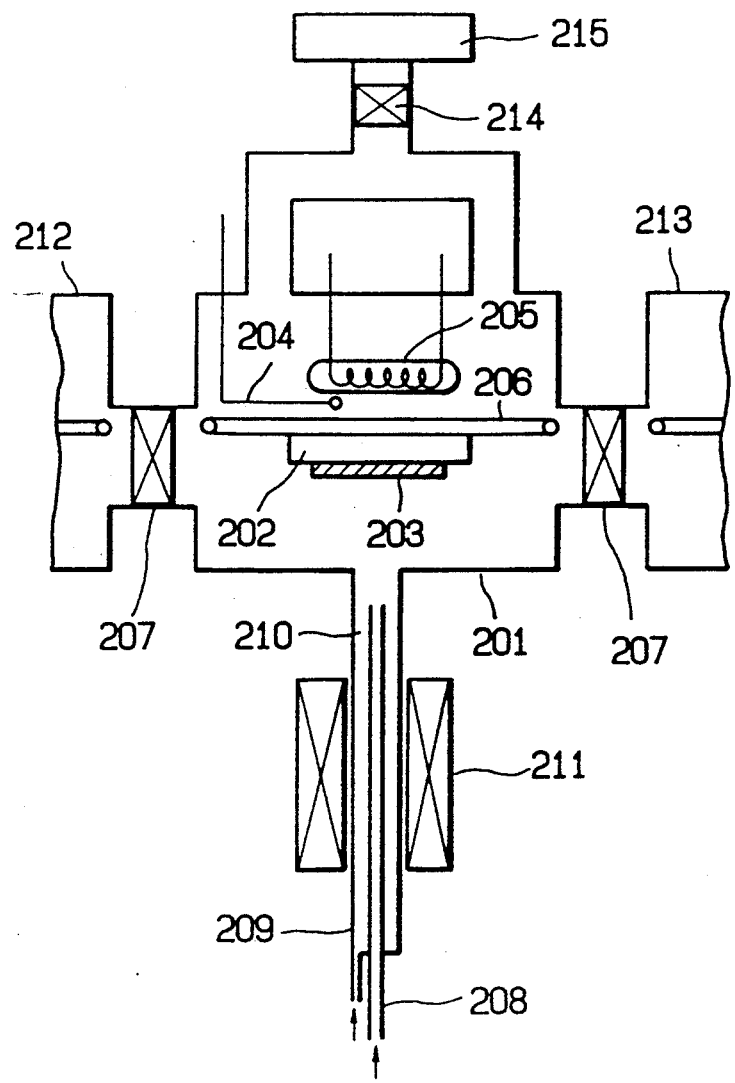
FIG. 2 is a schematic view for the embodiment of a deposited film forming apparatus for practicing the method (1) according to the present invention.

(ii) Then, the foregoing two substrates were set in parallel with each other at predetermined positions of a substrate holder 202 in a known apparatus shown in FIG. 2, a $ZnSe_{1-x}Te_x$:H film was formed on each substrates under the film-forming conditions shown in Table 1. In this way, there were prepared specimens Nos. 1-12 and specimens Nos. 1'-12'.

(iii) Then, the specimens Nos. 1-12 on the Si wafer were cut each into one-half size and respective one-half portions were cut each into 5 mm square size corresponding to the holder of a transmission type electron microscope (TEM). Each slice was secured on the surface of a glass plate of 50 mm×50 mm in size and 1 mm in thickness, with the side of the deposited film being in contact with the plate surface and secured with wax such that it could be observed from the other surface of the glass plate.

(iv) Then, a mixed solution of HF, $HNO_3$, $CH_3COOH$ and water, in which HF concentration was adjusted with water was provided. The exposed portion comprised of Si-single crystal wafer of the specimen prepared in (iii) above was engaged in etching treatment using the mixed solution. In this case, the etching rate was controlled by changing the HF concentration in the mixed solution.

The proceeding of the etching treatment was observed with the state of the transmission of light applied from the side of the deposited film and the treatment was terminated when the Si-single crystal wafer portion was completely removed by the etching.

(v) Then, wax was dissolved off with an organic solvent (toluene) from the specimen, and the deposited film portion was detached from the glass plate, washed with water and air-dried to obtain a test specimen composed of $ZnSe_{1-x}Te_x$:H film on the $SiO_2$ film.

(2) Measurement for the test specimen prepared in the above (1)

Each of the test specimens Nos. 1-12 on the Si wafer prepared as in the above (1) was fixed to the sample holder of TEM (acceleration voltage: 200 KeV), and transmission images were formed, and the resultant images were observed. For the thus formed transmission images, lattice fringe images with extremely less disorder were observed in the areas of the $ZnSe_{1-x}Te_x$:H film in which the crystal grain domain was present. And it was recognized that the lattice images are uniformly distributed for the entire region of the $ZnSe_{1-x}Te_x$:H film.

Based on the foregoing lattice fringe images, the extent of the crystal grain domain observed for a predetermined area of the test specimen was measured, and the proportion of the crystal grain domain in the deposited film was calculated by volume % and evaluated.

In this case, for confirmation purpose, orientation of crystal grains and the magnitude of the crystal grain domain were measured by X-ray diffractiometry, and the results obtained were taken into account.

(3) Measurement of the content of hydrogen atom (H) in the film (i) The specimens Nos. 1'-12' prepared on the quartz substrates in the above (1)-(i) were respectively cut into one-half size, and each cut specimen was placed in a vacuum chamber, heated from room temperature to 1000° C., and the content of H released from the specimen was determined using a conventional mass spectrometer. A specimen prepared under the conditions not containing H at all and then ion-implanted with a predetermined amount of H was used as the standard specimen.

(ii) Using the foregoing specimens Nos. 1-12 for TEM observation described above, the distribution states for Zn atom, Se atom and Te atom, as well as the elementary composition in the deposited film were analyzed for each of the specimens using an X-ray microanalyzer (manufactured by Shimazu Seisakusho: hereinafter simply referred to as "XMA"). The results obtained were as shown in Table 2. In the above case, the measurements were conducted as the matrix only for Zn, Se and Te, and because of this, the calculation was made with excluding H and others in the film.

From the thus obtained results, it has been confirmed for all of the specimens Nos. 1-12 that Zn atom, Se atom and Te atom are uniformly distributed in the deposited film and the composition ratio of Zn atom to the sum of Se atom and Te atom, that is Zn: (Se+Te), is about 1:1 which satisfies the stoichiometrical relationship. It has further been confirmed that the composition ratio of Se atom to Te atom, that is, Se:Te, is 2:8.

(4) Results

Figure 5:
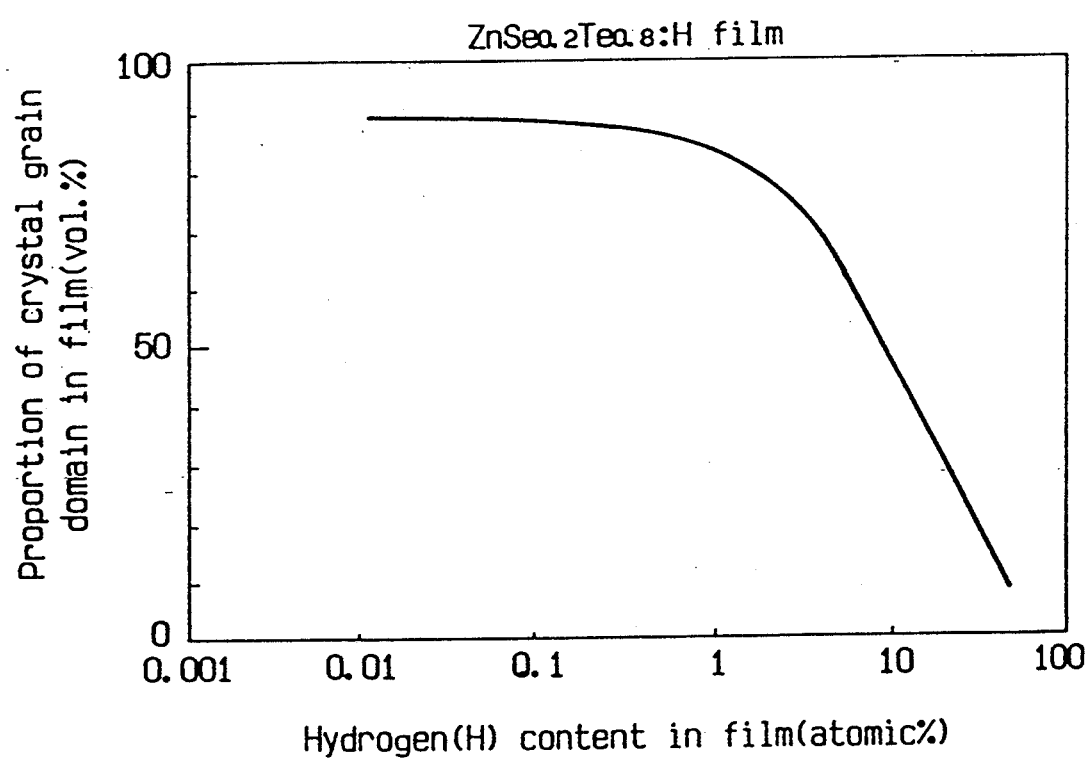
FIG. 5 is an explanatory view showing a relationship between the ratio of crystal grain domain and the hydrogen (H) content in the specimen films deposited on a Si wafer and a quartz substrate in Experiments A(2) and (3) in the present invention.

The results obtained in the above (2) and (3) were together shown in FIG. 5. From the results shown in FIG. 5, it has been confirmed that as the content of hydrogen atom (H) (atomic %) in $ZnSe_{1-x}Te_x$:H film (x=0.8) increases, the ratio of the crystal grain domain per unit volume in the film decreases, and the proportion of the crystal grain domain per unit volume in the film lies in range from 90 to 40% by volume at the hydrogen content in the range from 1 to 20 atomic %.

In addition, it has been found the facts that in the case where the $H_2$ gas flow rate was controlled to less than 0.05 sccm in the preparation of the specimen in the above (1), most part of the deposited film as formed was comprised of Zn and there was not formed any deposited film in the case where the flow rate of $H_2$ gas was made to be more than 2 slm.

B: Observations on the interrelations between the hydrogen content and the proportion of the crystal grain domain per unit volume in the deposited film, and the electrical properties of the deposited film A comb-like shaped Al electrode was vapor deposited on each of the remaining one-half parts of the specimens Nos. 1'-12' formed on the quartz crystals in the above (1)-(ii). The dark conductivity of each film was measured. The results obtained are collectively shown in FIG. 6. When observing the changes in the conductivity σ after irradiation of AM 1.5 light from the results of FIG. 6, it has been confirmed that the variation ratio of the dark conductivity observed as the ratio value $\Delta\sigma = \sigma/\sigma^\circ$ after 8 hours relative to the initial value $\sigma^\circ$ is suddenly increased when the content of the hydrogen atom (H) in the film exceeds 8 atomic % and that there is not any substantial change on the characteristics due to the light irradiation when the content of the hydrogen atom (H) is less than 4 atomic %.

Then, on each of the remaining-half parts of the specimens Nos. 1-12 of the $ZnSe_{0.2}Te_{0.8}$:H films prepared on the $SiO_2$ films formed on the Si-wafers in the above (1)-(ii), a semi-transparent Al film was vapor deposited. When light pulses of about 1 nsec from UV-rays were irradiated in a state where a pulse voltage being applied between the Al film and the Si wafer to make the Al film to be the negative side, and the hole drift mobility was measured in accordance with the known time-of-flight method. As a result, there were obtained the results for the dependency as shown in FIG. 7.

Figure 7:
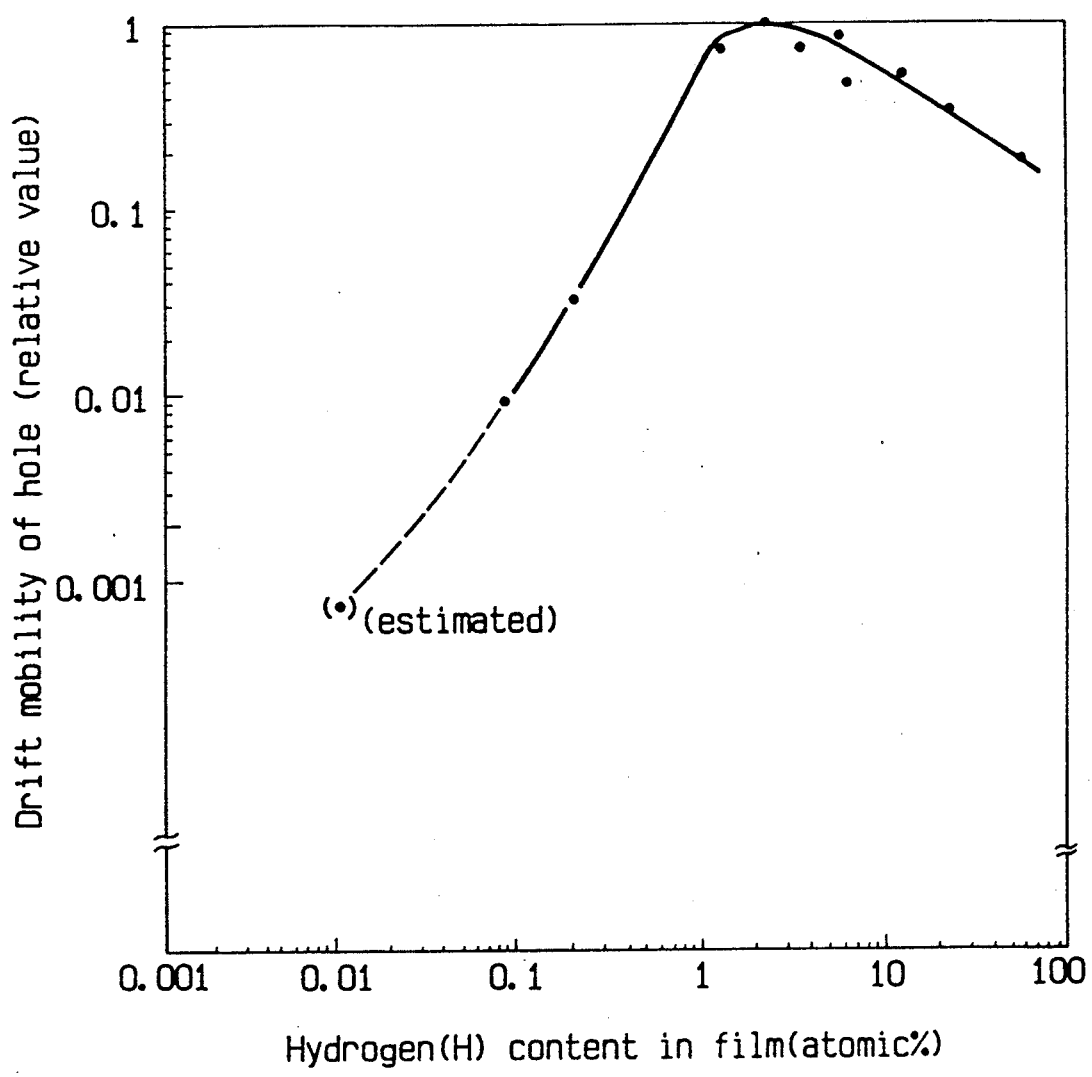
FIG. 7 is an explanatory view illustrating a relationship between the hydrogen (H) content in the film and the hole drift mobility in Experiment B in the present invention.

From the results of FIG. 7, it has been confirmed that the valve for the hole drift mobility is extremely small in the case where the content of hydrogen atom (H) in the film is less than 0.5 atomic % and a large value for the hole drift mobility may be obtained in the case where the content of hydrogen atom (H) content in the film is in the range from 1 to 8 atomic %. It has further been confirmed that the value for the hole drift mobility has a tendency to be gradually decreased when the content of hydrogen atom (H) in the film is made greater than 8 atomic %.

From the above results, it has been found that for the content of hydrogen atom (H) in the film, it is preferably less than 8 atomic %, and more preferably, 4 atomic % for the view point of changes in the characteristics due to the light irradiation, and it is preferably greater than 0.5 atomic %, and more preferably, greater than 1 atomic % in the view point of the hole mobilizing property.

As a result of considering the above findings with respect to the content of hydrogen atom (H) in the film while referring to the ratios relating to crystal grain domain per unit volume in the film shown in FIG. 5, it has been found that when the content of hydrogen atom (H) in the film constituted with $ZnSe_{1-x}Te_x$:H is in the range from 1 to 4 atomic %, the proportion of the crystal grain domain per unit volume is in the range from 65 to 85 volume %. Thus, it has been found that the electrical properties of the film constituted with $ZnSe_{1-x}Te_x$:H depend upon both the content of hydrogen atom (H) in the film and the proportion of crystal grain domain per unit volume in the film and that in order for the film to be immobilized as providing electrical properties preferably applicable to devices, for example, solar cell, it is necessary to satisfy both of the conditions, that the content of hydrogen atom (H) in the film be in the range from 1 to 4 atomic % and the proportion of the crystal grain domain per unit volume in the film be in the range from 65 to 85 volume %.

C: Observations on the interrelations between the content of hydrogen atom (H), the proportion of crystal grain domain per unit volume in the film and the doping characteristics of the film (1) There were provided specimens Nos. 13-24 and specimens Nos. 13'-24'. One specimen was prepared respectively by forming a $ZnSe_{1-x}Te_x$:H:Li film on a $SiO_2$ film formed on an Si-single crystal wafer and likewise, other specimen was prepared on a quartz glass substrate in the same manner as in the above (A) except that the condition of using $LiC_3H_7$ at $1.0 \times 10^{-10}$ mol/min was added to the starting material gas (A) in the film-forming conditions shown in Table 1.

(2) Respective specimens Nos. 13'-24' (specimens of deposited films on the quartz glass substrates) were cut each into one-half size. Then, a comb-like shaped aluminum electrode was vapor deposited on the surface of each one-half cut specimen by means of vacuum depositing. The dark conductivity of the film was measured. For the remaining cut specimen, the content of hydrogen atom (H) in the film was measured in the same manners as described above.

Figure 8:
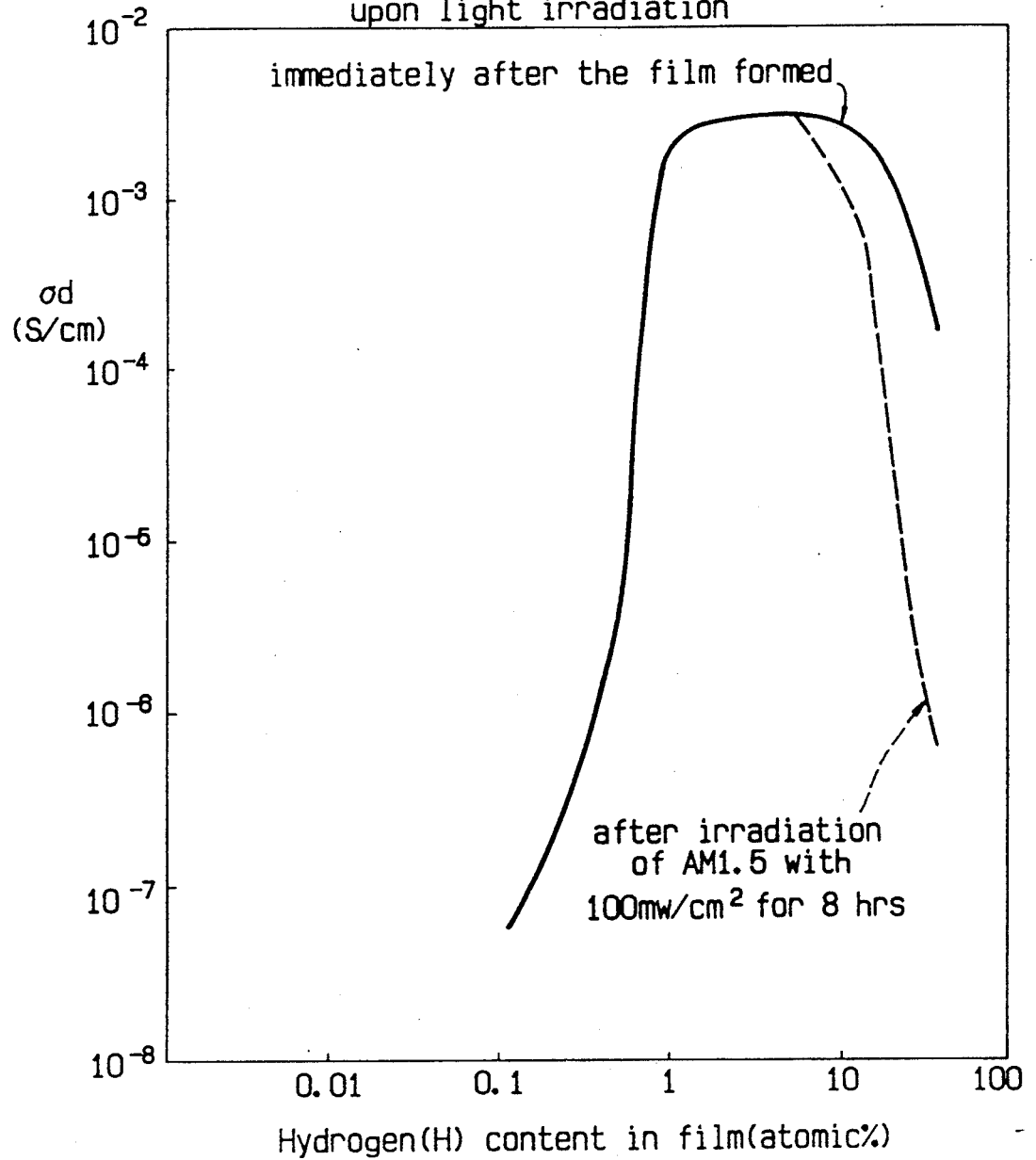
FIG. 8 is an explanatory view illustrating a relationship between the hydrogen (H) content in the film and the dark conductivity of the film in Experiment C in the present invention.

The results obtained are collectively shown in FIG. 8.

In FIG. 8, the solid line shows the dark conductivity of the $ZnSe_{1-x}Te_x$:H:Li film when measured with no irradiation hysteresis of light more intense than the room light, while the dotted line shows the value of the dark conductivity of the $ZnSe_{1-x}Te_x$:H:Li film when measured after continuous irradiation of AM-1.5 (100 mW/cm$^2$) for 8 hours.

When the conduction type was determined for the respective specimens having vapor-deposited with comb-like shaped Al-electrodes as described above by the measurement of thermoelectromotive force, p conduction type was shown for the specimen in which the H content in the film was greater than 0.25 atomic %, whereas a weak n conduction type was shown for the specimen in which the H content in the film was less than 0.08 atomic %.

Figure 9:
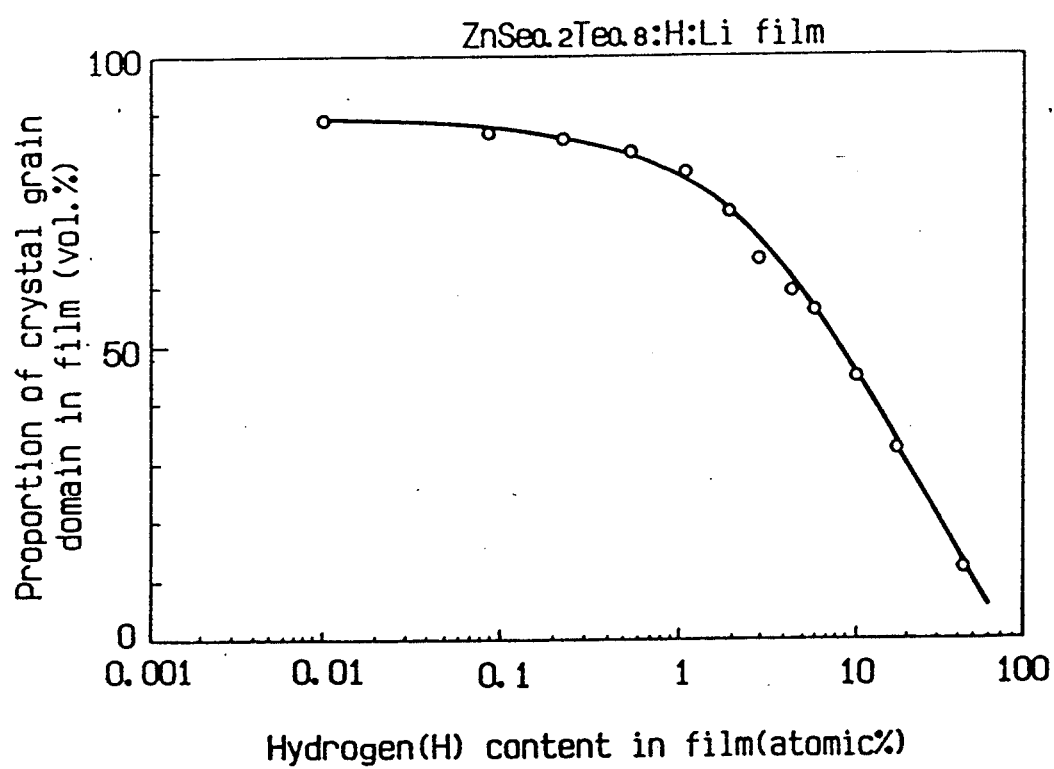
FIG. 9 is an explanatory view illustrating a relationship between the hydrogen (H) content in the film and the ratio of crystal grain domain in the film in Experiment C in the present invention.

(3) When the ratio of the crystal grain domain per unit volume in the film was observed by the same procedures as in the case (A) for the respective specimens Nos. 13-24, the relationship between the hydrogen content in the film and the proportion of crystal grain domain per unit volume in the film was substantially the same as that for the nondepoed film, and the relevant curve shown in FIG. 9 was obtained.

(4) From the results of FIGS. 8 and 9, it can be seen that a film with high doping efficiency contains amorphous grain regions of greater than 15% by volume. That is, it can be seen that in order for the film to be of high doping efficiency, it is necessary to have amorphous grain domains of more than 15% by volume.

That is, in the case where the amorphous grain portions are little, the flexibility of the structure becomes insufficient falling to obtain a sufficient stress relaxation at the boundary between the crystal grains and as a result, defects such as dangling bonds are increased. In this case, should the film be doped with a dopant, the dopant will be concentrated to the crystal grain boundary and not enter the inside of the crystal grains, and because of this, desired control of a valence electron and desired displacement of the dark conductivity become impossible to be attained.

On the other hand, in the case where amorphous grains in which dangling bonds being terminated with hydrogen atoms (H) are present by 15% by volume or greater at the boundary, flexibility is provided to the structure to reduce the foregoing drawbacks at the crystal grain boundary. In this respect, the displacement of the dark conductivity in the case of adding a dopant, that is, the doping efficiency becomes much more excellent as compared with that in the film with no amorphous grain domain. In the case of a film in which the amorphous grain domain is less than 15% by volume, since the flexibility of the structure is insufficient, the film will be easily removed from the substrate.

In view of the above, it can be seen that the presence of amorphous grain domains of 15% by volume or greater is necessary in the film.

(5) In the same manner as in the above (1), specimens Nos. 25-36, specimens Nos. 37-48, specimens Nos. 49-60 (on SiO$_2$ film), as well as specimens Nos. 25'-36', specimens Nos. 37'-48' and specimens Nos. 49'-60' (on quartz plate) were prepared respectively.

For the respective specimens Nos. 25-60, dark conductivity was measured by the same method as described above with no hysteresis of intense light irradiation. The results obtained are collectively shown in FIG. 10.

Figure 10:
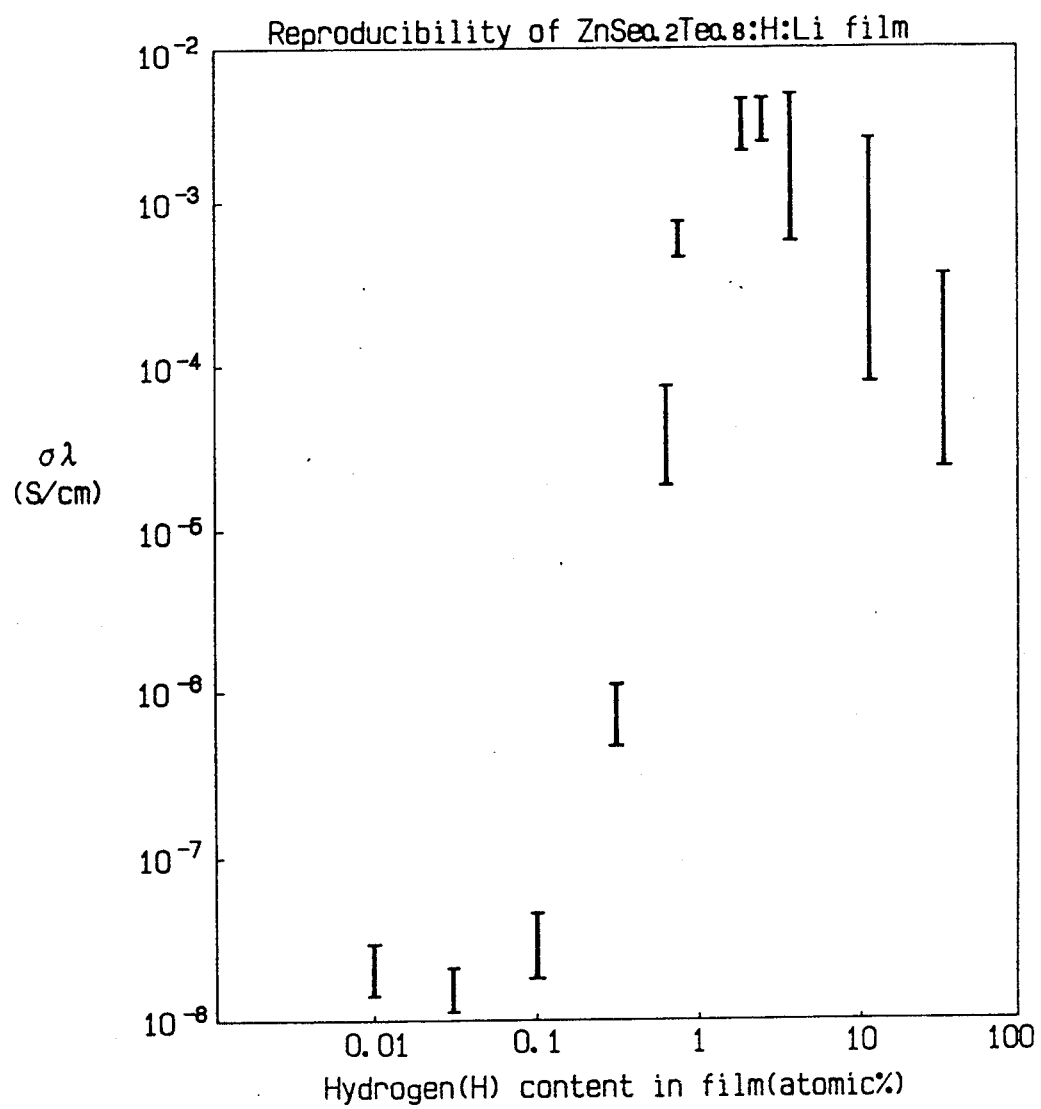
FIG. 10 is an explanatory view illustrating a relationship between the hydrogen (H) content in the film and the dark conductivity in Experiment C in the present invention.

From the results of FIG. 10, it can be seen that the value of the dark conductivity varies greatly depending upon the film-forming conditions and the scattering is some time remarkable in a region where the H$_2$ gas flow rate is large.

On the other hand, there were scarce scatterings for the measured results for the hydrogen content and also for the results of the observations on the proportions of the crystal grain domains in the films of the specimens Nos. 25'-60'.

For the specimens Nos. 25'-60', the dark conductivity varied greatly under the film-forming conditions of H$_2$ flow rate of greater than 30 sccm. In this case, films showed more than 5 atomic % of the hydrogen content and less than 65 volume % of the proportion for the crystal grain domain.

From the results as described above, the followings can be seen. That is, in the case where the proportion of the amorphous grain domain per unit volume exceeds a value of 35% by volume, the electrical contact between crystal grains is disconnected, and the conduction becomes to be predominantly determined by the amorphous grain domain, which results in reducing the dark conductivity. This causes to narrow the application range of a device with which such film being provided as a constituent material.

In addition, since the control for the valence electron and the displacement of the dark conductivity due to the doped dopant are greatly different between the crystal grain domain and the amorphous grain domain, it is difficult to obtain desired control for the valence electron and desired displacement of the dark conductivity. That is, in the case where a dopant is introduced not into the crystal grain domain but into the amorphous grain domain, a great scattering results for the characteristics to cause a problem that no desired dark conductivity be obtained. The reason why the dark conductivity changes greatly by the irradiation of intense light as shown in FIG. 8 can be understood also by the following reason. That is, in the case where the amorphous grain domain exceeds 35% by volume, the content of hydrogen atom in the film is remarkably large. This causes easy detachment of hydrogen atoms in the film due to aging change, change of boundary etc., and if such detachment should occur, this results in inviting deterioration in the characteristics of the films.

From the foregoing, it can be seen that for obtaining a ZnSe$_{1-z}$Te$_x$:H film with good reproducibility and a desired stable film quality, it is necessary that the content of hydrogen atom (H) in the film is to be less than 4 atomic % and the proportion of the crystal grain domain per unit volume is more than 65% by volume.

(6) There were prepared a ZnSe$_{1-z}$Te$_x$:H film and a ZnSe$_{1-z}$Te$_x$:H:Li film respectively using a quartz glass as the substrate by the same procedures as in the above (1) while variously varying the film-forming conditions. Examinations were made on the films thus obtained with respect to the interrelation between the hydrogen content in the film and the proportion of the crystal grain domain in the film, as well as the interrelation between the hydrogen content in the film and the electrical properties (variation ratio of the conductivity under AM-1 light irradiation, hole drift mobility, dark conductivity, etc.). As a result, it has been confirmed that any of the resultant films substantially satisfies the foregoing specific condition relating to the hydrogen content in the film and also the foregoing specific condition relating to the proportion of the crystal grain domain in the film. It has been also confirmed that there is an intense correlation between the electrical properties and the hydrogen content in the film, and the hydrogen content of from 1 to 4 atomic % in the film is optimum. It has been further confirmed that the proportion of the crystal grain domain in the film which satisfies the foregoing specific hydrogen content in the film is preferably from 65 to 85% by volume, and preferably, from 70 to 80% by volume.

D: Observations on the conductivities p-type doped ZnSe$_{1-z}$Te$_x$ films of which hydrogen content being varied by changing the amount of hydrogen atom to be introduced, wherein the Se/Te ratio was used as the parameter (1) Preparation of specimens (i) A quartz glass substrate of 2.5 cm square was used as a substrate.

(ii) The substrate was set to a predetermined position of a substrate holder 202 of a known apparatus as shown in FIG. 2, and a ZnSe$_{1-z}$Te$_x$:H film (0 < = x < = 1) was formed on the substrate under the film-forming conditions shown in Table 3. In this way, there were prepared 132 kinds of specimens. The specimen is referred to as L-N, in which L represents a flow rate of H$_2$ gas while N represents the flow ratio between DESe and DETe. As for the flow rate of H$_2$ gas, it was varied into 12 kinds from L=1 to 12, whereas the flow ratio between DESe and DETe was varied into 11 kinds from N≈1 to 11.

2. Measurement of the amount of H in the film

For the specimens formed on quartz substrates in the above (1)-(i), each specimen was cut into one-half size, and one of the cut specimen was placed in a vacuum chamber, heated at a temperature from room temperature to 1000° C., and the amount of hydrogen (H) released from the specimen was quantitatively determined by a mass spectrometer. As the standard specimen therein, there was used a specimen prepared under the conditions not containing H at all and which was implanted with a predetermined amount of H.

(ii) Further, using XMA, the distribution states of Zn atom, Se atom and Te atom, as well as the elementary composition in the deposited film were analyzed for each of the remaining cut specimens.

From the measured result as obtained, it has been recognized that for all of the specimens, the Zn atoms, Se atoms and Te atoms are uniformly distributed in the deposited film, and the composition ratio of Zn atom to the sum of Se atom and Te atom, that is, Zn:Se+Te is substantially 1:1 to satisfy the stoichiometrical relationship.

In addition, it has been confirmed that the quantitative ratio of Se/Te aimed at the time of setting the preparation conditions was attained for all of the specimens. That is, there could be prepared $ZnSe_{1-z}Te_x$ film with a desired quantitative ratio of Se/Te by controlling the flow rate of DESe to $1.5 \times 10^{-5}x(1-x)$ mol/min and that of DETe to $1.0 \times 10^{-5}x$ x mol/min.

(3) Measurement of the dark conductivity for p-type doped film

A comb-like shaped Al electrode with 0.2 mm gap was vapor deposited to each specimen on the quartz substrate used for the measurement in the above (2) - (ii). A voltage of 10 volt was applied thereon to measure the electric current in the dark place. That is, there was determined the dark conductivity for every specimen i.e. Li-doped film comprising $ZnSe_{1-z}Te_x$:H:Li material which was prepared under the conditions shown in Table 3.

The measured results obtained for the dark conductivity of the film were illustrated in connection to the content of hydrogen atom using the Se/Te quantitative ratio in FIG. 11.

And, as a result of determining the conduction type for every specimen in accordance with the known method of measuring the thermoelectromotive force, p-type conduction was shown for the specimens containing hydrogen atoms in an amount of more than 0.25 atomic %. On the other hand, a weak n-type conduction was shown for the specimens of which content of hydrogen atom being less than 0.08 atomic %.

Figure 12:
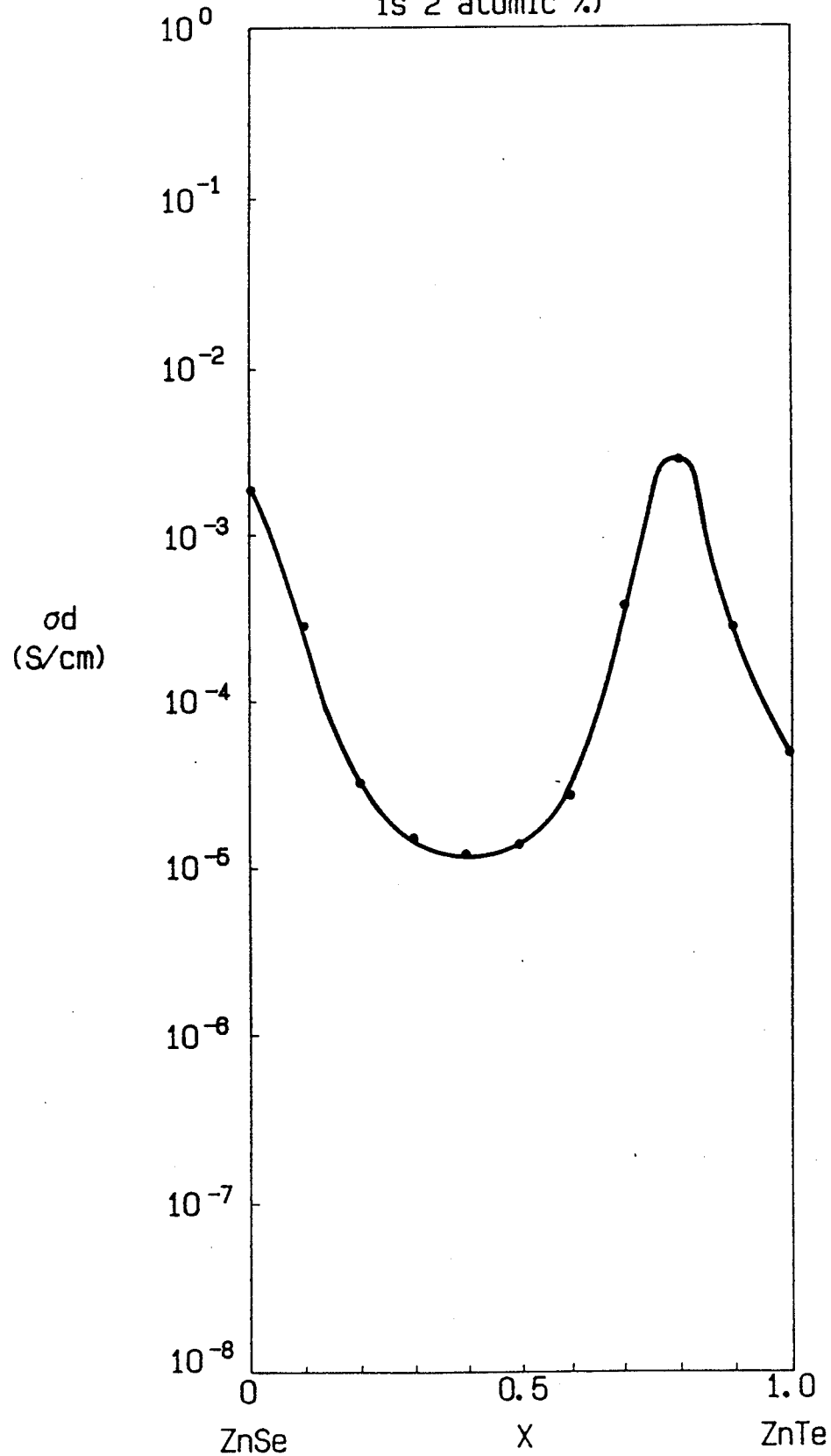
FIG. 12 is an explanatory view illustrating a relationship between the Se/Te quantity ration in the p-doped film and the dark conductivity in Experiment D in the present invention.

FIG. 12 illustrates the relationships of the dark conductivity to the Se/Te quantitative ratio where the content of hydrogen atom in the film is about 2 atomic %.

From the above experimental results, it has been confirmed that there affords a desired p-type conductivity for the film in the case where the content of the hydrogen atom is in the range from 1-10 atomic % and the quantitative ratio of Se to Te(Se:Te) in the film is in the range from 10:0 to 9:1 or in the range from 3:7 to 1:9.

E. Observations on $ZnSe_{1-z}Te_x$ films doped with n-type dopant (1) Preparation of specimens A plurality of n-type $ZnSe_{1-z}Te_x$ films were prepared by repeating the procedures for the preparation of the specimens in the above D, except that $(CH_3)_3Ga$(TMGa) was introduced at a flow rate of $5 \times 10^{-11}$ mol/min instead of the $LiC_3H_7$ as the p-type doping material gas.

(2) Measurement of the content for hydrogen atom (H) in the film

For each of the resultant specimens, the content of hydrogen atom, and the composition for Zn atom, Se atom and Te atom in the film were analyzed by the method as described in the above (A).

It has been confirmed for all of the resultant specimens that the composition ratio of the Zn atom to the sum of the Se atom and the Te atom, i.e., Zn:Se+Te is about 1:1, which satisfies the stiochiometrical relationship.

In addition, it has also been confirmed that the quantitative ratio of Se/Te aimed at the time of setting the preparation conditions was attained for all of the resultant specimens.

(3) Measurement of the dark conductivity for n-type doped film

For each of the foregoing $ZnSe_{1-z}Te_x$:H:Ga films, there was examined the dark conductivity in the same way as in the above A.

Figure 13:
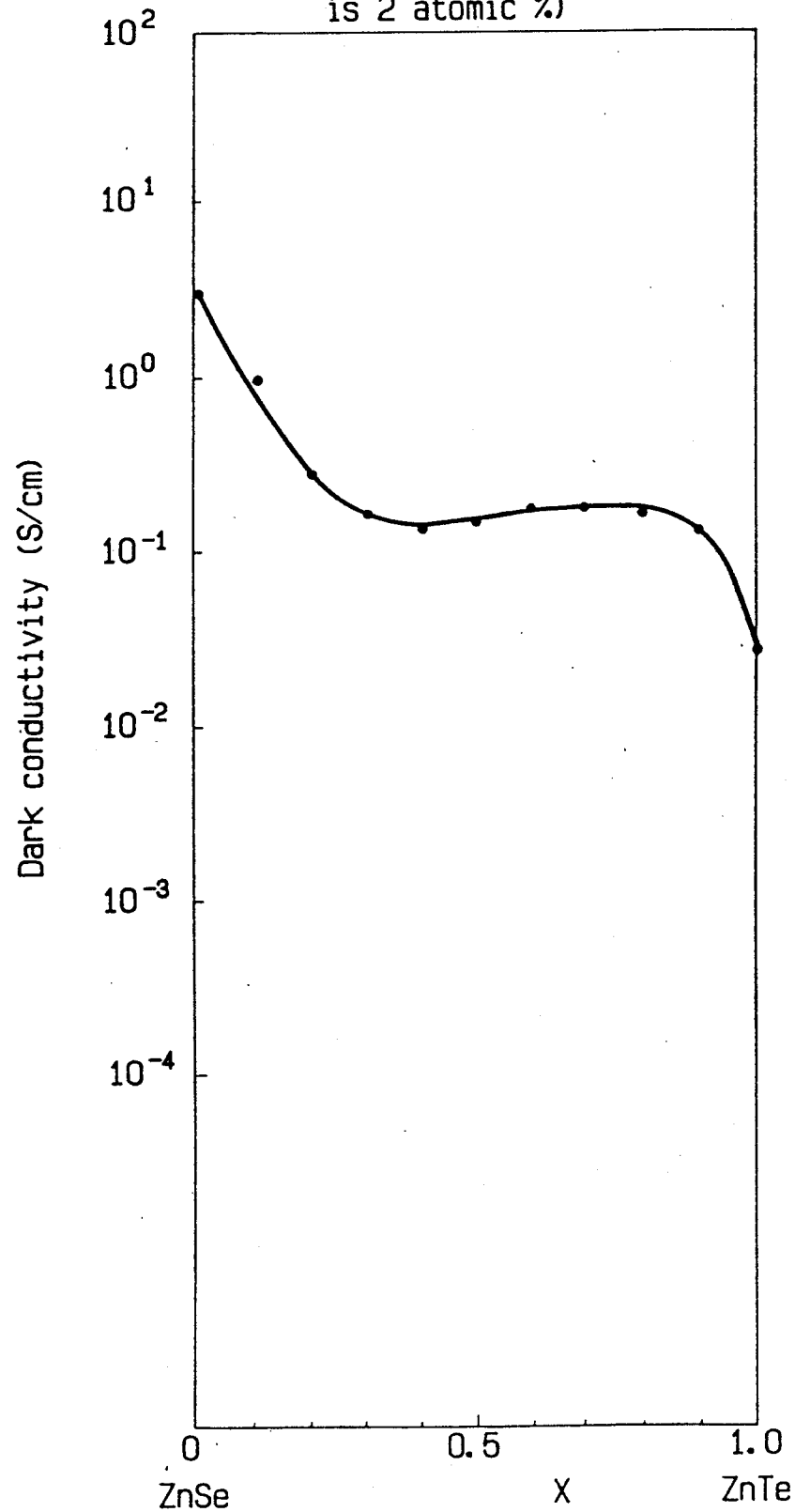
FIG. 13 is an explanatory view illustrating a relationship between the Se/Te quantity ratio in the n-doped film and the dark conductivity in Experiment E in the present invention.

Further, when the conduction type was determined in accordance with the known method of measuring thermoelectromotive force, the conduction of n-type was shown for all of the specimens. It has been found that the changes in the dark conductivity in connection with the content of hydrogen atom are similar to those in the case of the foregoing p-type $ZnSe_{1-z}Te_x$:H:Li films, and that the maximum conductivity may be obtained with the content of hydrogen atom in the range from 1 to 10 atomic %. In FIG. 13, there are shown experimental results relating to the changes in the conductivity versus each quantitative ratio of Se to Te (Se:Te) for the film containing 2 atomic % of hydrogen atoms. It can be see from FIG. 13 that a desired dark conductivity has been obtained in all the mentioned regions for the Se:Te quantitative ratio.

F. Observations on the dependency of optical band gap for the Se:Te quantitative ratio in $ZnSe_{1-z}Te_x$:H film (i) Preparation of specimens A plurality of $ZnSe_{1-z}Te_x$:H films of which composition ratios between Se and Te being varied were prepared on respective quartz substrates by repeating the procedures described in the above D, except that $H_2$ gas was introduced at a flow rate of 15 SCCM without introducing any doping gas.

(ii) Composition analysis for the resultant specimens

The content of hydrogen atom (H) and the quantitative ratios of Zn, Se and Te for each of the specimens were examined by the method as described in the above A. As a result, it has been found that for every specimen, the content of hydrogen atom is about 2 atomic % and the quantitative ratio of Zn to the sum of Se and Te is 1:1, which satisfies the stoichiometrical relationship. It has been then confirmed that the quantitative ratio of Se/Te is a desired one as initially expected at the time of setting each of flow rates for DESe and DETe when setting the preparation conditions.

(iii) Measurement of the optical band gap

For every specimen, changes in the absorption coefficient relative to the wavelength of light were determined using a conventional spectrophotometer, and the optical band gap was determined from the absorption end.

Figure 14:
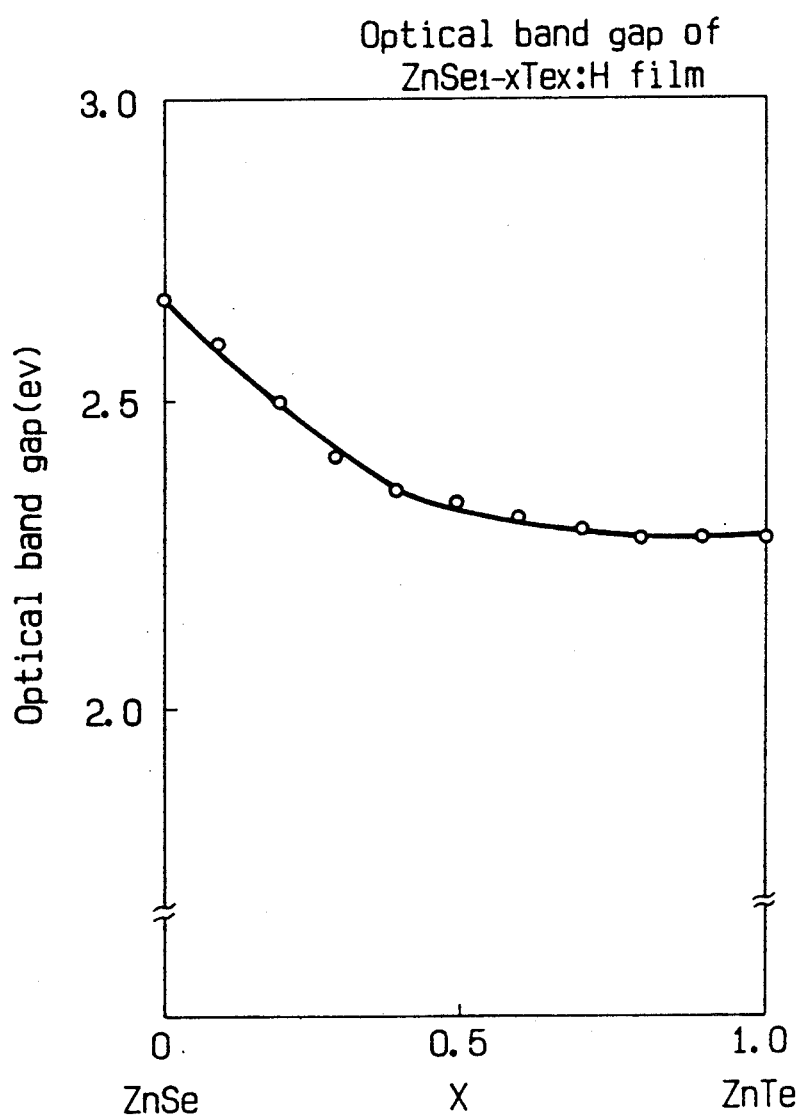
FIG. 14 is an explanatory view illustrating a relationship between the Se/Te quantity ratio in the film and the optical band gap in Experiment F in the present invention.

In FIG. 14, there are shown the results obtained with respect to the changes in the optical band gap to the Se:Te quantitative ratio in the $ZnSe_{1-z}Te_x$:H film (H content: 2 atomic %).

It can be seen from what is shown in FIG. 14 that the optical band gap is in the range from 2.3 to 2.2 eV for the film with the Se:Te quantitative ratio of 7:3 or more.

G. Observations on the proportion of the crystal grain domains to formed in non-doped ZnSe$_{1-z}$Te$_x$:H film and doped ZnSe$_{1-z}$Te$_x$:H:M film (M represents dopant element)

(1) Preparation of specimens

Using two kinds of substrates i.e. Si-wafer having a SiO$_2$ film formed by way of thermal oxidation thereon and a quartz plate as in the above A, there were prepared a plurality of p-type, n-type and non-doped ZnSe$_{1-z}$Te$_x$:H films of which quantitative ratios of Se/Te being varied in the way similar to that described in the above A and under the conditions shown in Table 4.

And, in this case, TMGa was introduced when preparing n-type ZnSe$_{1-z}$Te$_x$:H film, and LiC$_3$H$_7$ was introduced when preparing p-type ZnSe$_{1-z}$Te$_x$:H film. Further, any doping gas was not introduced when preparing non-doped ZnSe$_{1-z}$Te$_x$:H film.

The amounts of DESe and DETe to be introduced were set so as to satisfy the following conditions with respect to x at the time of preparing a ZnSe$_{1-z}$Te$_x$:H:M film:
the amount of DESe: $1.2 \times 10^{-5} (1-x)$ mol/min and the amount of DETe: $1.0 \times 10^{-5} x$ mol/min In each of the above cases, every starting material was controlled by adjusting the temperature of thermostable water surrounding the bubbler containing the starting material to a desired temperature by an electric heater.

(2) Composition analysis of the specimen

The content of hydrogen atom (H) and the compositions of Zn atom, Se atom and Te atom were examined for each of the specimens on the quartz substrates by the method as described in the above A.

As a result, it has been found for every specimen that the content of the hydrogen atom is about 2 atomic %, and the quantitative ratio of Zn to the sum of Se and Te is 1:1, which satisfies the stoichiometrical relationship. Then, it has been confirmed that the Se:Te ratio is a desired one as initially expected at the time of setting each of the flow rates for DESe, DETe when setting the film-forming conditions.

(3) Observations on the proportion of crystal grain domain for each of the specimens Lattice fringe images were observed be TEM in the same way as described in the above D.

(4) Results

Figure 15:
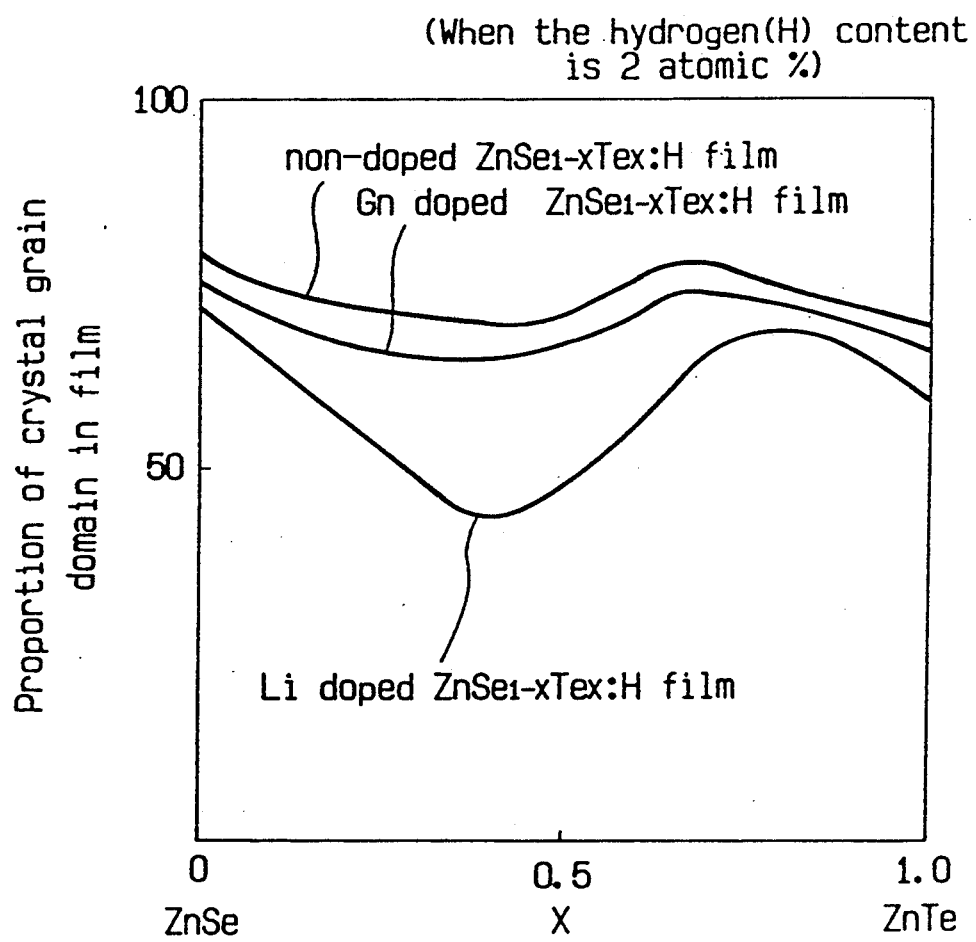
FIG. 15 is an explanatory view illustrating a relationship between the Se/Te quantity ratio in the film and the ratio of crystal grain domain in the film in Experiment G in the present invention.

From the results obtained in the above (2) and (3), in FIG. 15, there are shown experimental results from the above (2) and (3) relating to the changes in the proportion of the crystal grain domain versus the Se:Te quantitative ratios for the non-doped, Ga-doped and Li-doped ZnSeTe:H films at the hydrogen atom content of about 2 atomic %.

The present invention has been accomplished based on the experimental results described above, and it concerns a functional deposited film comprising a material represented by the formula: ZnSe$_{1-z}$Te$_x$:H constituted with zinc atoms (Zn), selenium atoms (Se) and at least hydrogen atoms (H), of which quantitative ratio of Se to Te being in the range from 3.7 to 1.9 by the atom number ratio, the hydrogen atoms being contained in an amount from 1 to 4 atomic % and the proportion of crystal grains per unit volume being from 65 to 85% by volume, as well as a functional deposited film comprising a material represented by the formula: ZnSe$_{1-z}$Te$_x$:H:M (M represents a dopant), prepared by doping the foregoing deposited film with a proper dopant.

The aforesaid deposited films to be provided according to the present invention are widely usable. And upon application purposes, any of them may be formed on a substrate of an appropriate shape such as plate-form or cylindrical form. Further, any of them may be formed on a previously formed certain film on such substrate.

The ZnSe$_{1-z}$Te$_x$:H film according to the present invention contains Zn atoms, Se atoms and Te atoms respectively in a uniformly distributed state with the composition ratio of the Zn atom to the sum of the Se atom and the Te atom to satisfy the stoichiometrical ratio: the quantitative ratio of the Se atom and the Te atom being in the range from 3:7 to 1:9 by the ratio of atom number; the hydrogen atoms being contained in an amount from 1 to 4 atomic % in a state suitably terminating the dangling bonds of one or more of Zn atoms, Se atoms and Te atoms or occasionally in a free state: which contains crystal grain domains and non-amorphous grain domains, the crystal grain domains being uniformly distributed in the entire region of the film: the content of the crystal grains per unit volume in the film being from 65 to 85% by volume: and which is excellent in the homogeneity of the structure and the composition.

The foregoing ZnSe$_{1-z}$Te$_x$:H film to be provided according to the present invention is that the stresses generated is being relaxed to a desirable state and it has a wealth of extremely improved electrical and mechanical properties. Further, it is excellent in the adhesion not only with a substrate but also with other deposited films.

Further in addition, because the dangling bonds of the constituent atoms are to be desirably reduced, the ZnSe$_{1-z}$Te$_x$:H film according to the present invention enables the incorporation of a dopant thereinto extremely facilitates the effective introduction thereof. Because of this, it becomes possible to afford an improved ZnSe$_{1-z}$Te$_x$:H:Mp film (Mp represents a p-type dopant) having excellent semiconductive characteristics: the stresses being relaxed to a desirable state; having a wealth of extremely improved electrical and mechanical properties: and being excellent in the adhesion not only with a substrate but also with other films.

For the Mp in the ZnSe$_{1-z}$Te$_x$:H:Mp film according to the present invention, it may be a member selected from the group consisting of Groups IA, IB and VA elements of the Periodic Table. Specifically, there can be illustrated Li, Na, K and Rb for the Group IA element, Cu and Ag for the Group IB element, and P, As and Sb for the Group VA element. Among these elements, Li, P and As are most desired. The amount of the Mp to be contained in the film is preferably from 2 to $1 \times 10^4$ atomic ppm, more preferably 30 to $5 \times 10^3$ atomic ppm, and most preferably, from 50 to $1 \times 10^3$ atomic ppm.

For the ZnSe$_{1-x}$Te$_x$:H film according to the present invention, an n-type dopant (hereinafter referred to as "Mn") may be also incorporated easily thereinto as well as in the case of incorporating the foregoing p-type dopant. In this case, there can be provided an excellent n-conduction type functional deposited film. As for the Mm therein, it may be a member selected from the group consisting of Groups III B, IV B and VII B elements of the Periodic Table. Specifically, there can be illustrated B, Al, Ga and In for the Group III B element, Si, Ge, C and Sn for the IV B element, and F, Cl, Br and I for the Group VII B element. Among these elements, B, Al, Ga and In are most desired.

As for the amount of the Mn to be contained in the film, it is preferably from 2 to $1 \times 10^4$ atomic ppm, more preferably from 30 to $5 \times 10^3$ atomic ppm, and most preferably, from 50 to $1 \times 10^3$ atomic ppm.

As described above, the functional deposited film according to the present invention is characterized in that the content of hydrogen atom and the proportion of crystal grain domains per unit volume are adjusted within the predetermined ranges. As for the content of the hydrogen atom, in the case where it is less than 1 atomic %, the amount of dangling bonds formed is undesirably increased. On the other hand, in the case where it exceeds 4 atomic %, lattice disorder or/and void will occur to increase defects. Thus, any desirable deposited film having desired characteristics can not be obtained in either of the cases. Further, as for the proportion of the crystal grain domains, in the case where it is less than 65% by volume, the absolute magnitude of the crystal grains of being one of the factors causing the improvement of the electrical properties is reduced. On the other hand, in the case where it exceeds 85% by volume, crystal gains are directly joined with each other to form the so-called crystal grain boundary to cause defects due to incommensurateness of the lattice, etc. Thus, no deposited films having desirable characteristics can be obtained in either of the cases.

Now, in the case of using the $ZnSe_{1-z}Te_x$:H film according to the present invention in the preparation of a photovoltatic element such as solar cell to be used in a high longitudinal place such as Japan, it is desired that the optical band gap of the constituent material, particularly, the constituent material for the photocharge generation layer is less than 2.4 eV since UV-rays with the wavelength of shorter than 500 nm are insufficient in such place. It is understood from what shown in FIG. 14 that the Se/Te quantitative ratio capable of satisfying said condition is in the range Se/Te=3/7 to 0/10 in view of FIG. 14.

Figure 11:
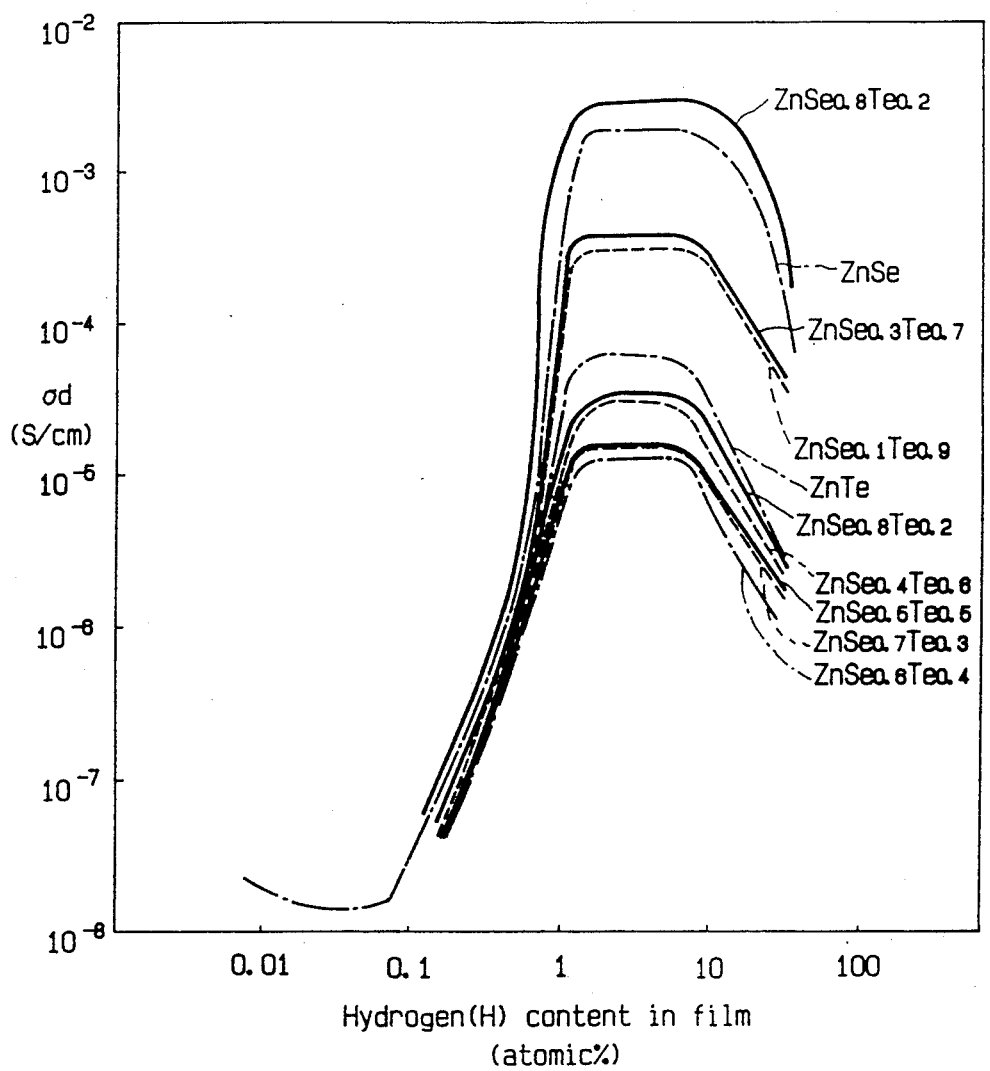
FIG. 11 is an explanatory view illustrating a relationship between the hydrogen (H) content in the film and the dark conductivity using Se/Te quantity ratio in a p-doped film as the parameter in Experiment D in the present invention.

For the p-typed film, the Se/Te quantitative ratio with which a sufficiently high p-type conductivity is afforded is understood to be in the range from 10:0 to 9:1 or in the range from 3:7 to 1:9 from what shown in FIG. 11 or FIG. range 12.

The reasons why the p-type conductivity is increased in the above-mentioned ranges can be explained in relation with the proportion of the crystal grain domains to the Se/Te quantitative ratio in the film shown in FIG. 15.

That is, the proportion of the crystal grain domains in the film is higher than 65% by volume at a Se/Te quantitative ratio in the film being in the range from 10:0 to 9:1 and in the range from 3:7 to 1:9.

Because of this, the doping efficiency for the p-type dopant becomes sufficiently high.

Referring to the results shown in FIG. 15, a high proportion of the crystal grain domains is observed all over the ranges for the Se/Te quantitative ratio for the non-doped $ZnSe_{1-z}Te_x$:H film. Further, for the film to which n-type dopant (Ga) is added, although there is observed a slight reduction in the proportion of the crystal grain domains is for all over the ranges for the Se/Te quantitative ratio, it is still sufficiently high.

While on other hand, for the film to which p-type dopant (Li) is added, there is generally observed a reduction in the proportion of the crystal grain domains, and particularly, a remarkable reduction in the proportion of the crystal grain domains is observed at a Se/Te quantitative ratio in the range of Se:Te=8:2 to 4:6.

From what mentioned above, it is understood what is desirable p-type doped films having satisfactory characteristics may be obtained in the case where the Se:Te quantitative ratio is controlled to a value in the range from 3:7 to 1:9.

Since the functional deposited films to be provided according to the present invention is one that has a satisfactory conductivity, it may be used in the preparation of various electronic devices, such as photovoltatic element in combination with a substrate as well as with a semiconductor thin film having another conduction type or made of a different material depending on the application use of the product.

Typical examples of the photovoltatic elements using the functional deposited films according to the present invention will be detailed below, but these examples are not intended to limit the application uses of the functional deposited films according to the present invention.

FIG. 1 is a schematic view for a typical embodiment of a layer structure in the case where the functional deposited film according to the present invention is used for a photovoltatic element.

The embodiment shown in FIG. 1 is a photovoltatic element 100 comprising, on a substrate 101, an n-type semiconductor layer 102, a p-type semiconductor layer 103 comprising the functional deposited film according to the present invention and an electrode 104 disposed in this order.

It is of course possible to replace the n-type semiconductor layer and the p-type semiconductor layer with each other depending on the application uses.

Explanation will be made regarding substrate, the semiconductor layers and the electrode of the photovoltatative element 100. Since the p-type semiconductor is the functional deposited film according to the present invention which had already been described specifically above, the explanation therefor is omitted here.

Substrate

The substrate 101 may be of either single crystal or amorphous material, which may be electroconductive or electroinsulating. Examples of them are metals such as Fe, Ni, Cr, Al, Mo, Au, Nb, Ta, V, Ti, Pt and Pb or alloys thereof, for example, brass, stainless steels, etc.

In addition, there can be mentioned films or sheets of synthetic resin such as polyester, polyethylene, polycarbonate, cellulose acetate, polypropylene, polyvinyl chloride, polyvinylidene chloride, polystyrene, polyamide and polyimide and others than these, glass, ceramics, etc. In the case of using the latter material as the electrically insulating substrate, the electroconductivity is provided to the surface by way of the known electroconductive treatment, and a semiconductor layer is desirably disposed to the thus treated surface.

For instance, in the case of glass, electroconductivity is provided to the surface by disposing a thin film composed of Ni, Cr, Al, Mo, Au, Ir, Nb, Ta, V, Ti, Pt, Pd, $In_2O_3$, $SnO_2$, ITO ($In_2O_3=SnO_2$), etc. In the case of a synthetic resin film such as polyester film, electroconductivity is provided to the surface thereof by applying a thin film of metal such as Ni, Cr, Al, Ag, Tb, Zn, Ni, Au, Mo, Ir, Nb, Ta, V, Tl, Pt, Pd, $In_2O_3$ by means of vapor deposition under vacuum, electron beam deposition, sputtering, etc. at a temperature lower than the heat resistant temperature of the support material, or applying a laminate treatment to the film surface by using the above-mentioned metal.

As the single crystal support, there can be mentioned those prepared from single crystals of Si, Ge, C, NaCl, KCl, LiF, GaSb, InAs, InSb, GaP, MgO, CaF, BaF, $\alpha$-$Al_2O_3$ by slicing them into a wafer-like configuration, as well as those further epitaxially growing the same material or the material with similar lattice constant on the above-mentioned substrate.

The shape of the substrate may be of any configuration such as plate-like shape, elongate belt-like shape or cylindrical shape with smooth or uneven surface. The thickness thereof is properly determined such that a desired photovoltaic element can be provided. In the case where flexibility is required for the photovoltaic element, it can be made as thin as possible within a range capable of sufficiently providing the function as the substrate. However, the thickness is usually greater than 10 $\mu$m in view of the fabrication and handling or mechanical strength of the substrate.

n-type conductor layer

As the n-type semiconductor layer 102, the ZnSe:H film according to the present invention as described above and the ZnSe:H:Mn film obtained by incorporating an n-type dopant to said film (Mn represents an n-type dopant) can be desirably used.

Electrode

The surface through which light is impinged for generating a photovoltage is decided depending on whether the material constituting the substrate 101 is light permeable or not (for instance, light for generating a photovoltage is impinged from the side of the electrode 104 in the case where there is used a light impermeable material as the substrate 101). In view of this, it is selectively used a light permeable material or a light impermeable material as the electrode 104 depending upon the situation.

As the light permeable electrode material, that is the so-called transparent electrode material, there can be mentioned, for example, thin metal oxide films or thin metal films. Specific examples are ITO ($In_2O_3 = SnO_2$), SnO and ZnO thin films and other than these, very thin Au, Al or Cu films.

As the light impermeable electrode material, there can be mentioned thin metal films such as of Al, Cr, Ni, Ag, Pt, Au, Mo, Ir, Nb, Ta, V, Ti and Pd.

For any of the electrode materials as described above, due consideration should be made such that it does neither cause reduction in the transmittance of the incident light nor become to be the resistive ingredient thereto for the photovoltaic element. In view of this, it is desired to use such that the transmittance is higher than 85% when used as the transparent electrode and the sheet resistance value is lower than 100 $\Omega$.

The present invention includes the following three processes (1), (2) and (3) for preparing a functional deposited film comprising an amorphous $ZnSe_{1-x}Te_x$:H material containing hydrogen atoms in a specific amount as described above.

(1) A method of preparing a functional deposited film comprising $ZnSe_{1-x}Te_x$:H, by introducing a starting material gas containing Se atoms, another starting gas containing Te atoms and a hydrogen gas ($H_2$) into a separate activation space isolated from a film-forming chamber: applying activation energy to these gases to excite them thereby causing (i) a Se-containing precursor, (ii) a Te-containing precursor and (iii) an atomic hydrogen radical: introducing the resultant gases containing the precursors (i) and (ii) and the hydrogen radical (iii) into the film-forming chamber: simultaneously introducing a Zn atom-containing starting gas to the film-forming chamber; and causing chemical reactions among the gases as introduced in the reaction space while controlling the surface of a substrate placed in the film-forming chamber to a desired temperature.

(2) A method of preparing a functional deposited film comprising $ZnSe_{1-x}Te_x$:H, by introducing into a film-forming chamber a Se atom containing starting gas, a Te atom-containing starting gas, hydrogen gas ($H_2$) and a Zn atom-containing starting gas so as to well mix to form a mixture of the gases as introduced in the reaction space of the film-forming chamber in which a substrate being placed: applying high frequency power to a cathode disposed in the film-forming chamber to form plasmas in the reaction space: and decomposing, polymerizing, radicalizing and ionizing the introduced gases to chemically react with each other.

(3) A method of preparing a functional deposited film comprising $ZnSe_{1-x}Te_x$:H by introducing Ar gas and $H_2$ gas into a film-forming chamber in which a substrate is disposed, a cathode is disposed at a position opposed to the substrate leaving a predetermined space relative to the substrate and a polycrystalline $ZnSe_{1-x}Te_x$:H as the target is disposed on the surface of the cathode, applying high frequency voltage to the cathode to thereby sputter the polycrystalline $ZnSe_{1-x}Te_x$:H target: simultaneously forming a plasma atmosphere in the space: and chemically reacting the atomic Se, Te and Zn caused from the target and the atomic hydrogen caused from the $H_2$ gas by the action of plasmas as generated in the space near the surface of the substrate.

It is of course possible to make the functional deposited films obtained by the methods (1) to (3) to be semiconductor films containing dopants. Particularly, it is possible to incorporate a p-type dopant into the $ZnSe_{1-x}Te_x$:H film to thereby provide a $ZnSe_{1-x}Te_x$:H film of p- conduction type which used to be impossible to prepare in the past. In this case, the purpose can be attained by introducing a gas containing a p-type dopant independently or together with the starting gas or the hydrogen gas into the film-forming chamber.

Details for the methods (1) to (3) in the present invention will be described below.

Methods (1) and (2)

As the starting material for introducing Zn (hereinafter referred to as "starting material A"), an alkyl zinc compound capable of being easily gasified which is represented by the general formula: R-Zn in which R represents an alkyl group of 1 to 4 carbon atoms is preferably used. Specific Examples of the alkyl zinc compound are, typically, dimethyl zinc (DMZn) and diethyl zinc (DEZn). Since these organic zinc compounds are in the liquid state at room temperature, they are bubbled into gases by using an inert gas such as Ar, He, etc. as the carrier gas upon use. Further, as the starting material for introducing Se, there can be mentioned gaseous or gasifiable hydrogen selenide ($H_2Se$), selenium halide and, alkyl selenium compounds represented by the general formula: R'-Se in which R' represents an alkyl group of 1 to 4 carbon atoms. As the selenium halide, selenium hexafluoride is most preferred. Specific examples of the alkyl selenium compound are dimethyl selenium (DMSe) and diethyl selenium (DESe). Further, as the starting material for introducing Te, there can be preferably mentioned gaseous or gasifiable hydrogen telluride ($H_2Te$), tellurium halide and alkyl tellurium compounds represented by the general formula: R'-Te in which R' represents an alkyl group of 1 to 4 carbon atoms, etc. As the tellurium halide, tellurium hexafluoride is most preferred. Specific examples of the alkyl tellurium compound are dimethyl tellurium (DMTe) and diethyl tellurium (DETe).

(The starting material for introducing Se and the starting material for introducing Te are hereinafter collectively referred to as "starting material B".)

For the starting materials (B), those in the liquid state or in the solid state but not in the gaseous state at room temperature are gasified by means of bubbling, heat sublimation, etc. using an inert gas such as Ar, He as the carrier gas.

When obtaining the $ZnSe_{1-x}Te_x$:H film by the method (1) or (2), $H_2$ gas is positively used.

Incidentally, in a preferred embodiment of the method (1) $H_2$ gas is introduced together with the gaseous starting material B into an activation space to excite them. In this case, if the starting material B is not in the gaseous state, it is possible to gasify it using the foregoing inert gas or $H_2$ gas in the activation space and the resulting gas is subjected to the action of the activation energy.

In the method (1), it is of course possible to introduce only $H_2$ gas into a separate activation space situated independently from the foregoing activation space.

As the activation energy, electric discharge energy, heat energy, light energy, etc. can be optionally used and these may be used in combination.

In order to excite the starting material B to form active species, other than the foregoing activation energy, there can be used an appropriate catalyst.

To form a $ZnSe_{1-x}Te_x$:H film of p-conduction type (hereinafter simply referred to as "P-type $ZnSe_{1-x}Te_x$:H:M film" in which M represents a p-type dopant) by the method (1) or (2), it can be attained by introducing a starting material providing a gaseous p-type dopant (hereinafter referred as "p-type dopant material") together with a gaseous starting material A or a gaseous starting material B or $H_2$ gas or otherwise, independently into the film-forming chamber.

As the p-type dopant material, gaseous or easily gasifiable compounds can suitably be used. Specific examples of the p-type dopant material are, for example, mentioned organic lithium compounds which are liquid at room temperature such as propyl lithium ($LiC_3H_7$), secondary butyl lithium (Li(sec-$C_4H_9$)) and inorganic lithium compounds which are solid at room temperature such as lithium sulfide ($Li_2S$) and lithium nitride ($Li_2N$). In addition, there can also be exemplified $AsH_3$, $PH_3$, $P_2H_4$, $AsF_3$, $AsCl_3$, $PF_5$, $PF_3$, $PCl_3$, $SbH_3$, $SbF_3$, etc.

In the case of using the organic lithium compound which is liquid at room temperature as the p-type dopant material, it is gasified by bubbling it using an inert gas such as Ar or He or $H_2$ gas as the carrier gas as above described for the starting material A or the starting material B. In the case of using the inorganic lithium compound which is solid at room temperature, it is gasified by heat sublimation in a heat sublimation furnace using Ar, He, etc. as the carrier gas.

Further, as the n-type dopant material, there can be optionally used a member selected from those which are gaseous at room temperature or easily gasifiable depending upon the situation as in the case of the p-type dopant material. Specifically, there can be mentioned trimethylaluminum (Al(CH$_3$)), triethylaluminum (Al $C_2H_5$)), trimethylgallium (Ga(CH$_3$)), triethylgallium (Ga($C_2H_5$)), trimethylindium (In(CH$_3$)), triethylindium (In($C_2H_5$)), diborane ($B_2H_6$), monosilane ($SiH_4$), disilane ($Si_2H_4$), monogerman ($GeH_4$), hydrogenated tin ($SnH_4$), methane ($CH_4$), ethane $C_2H_6$, ethylene ($C_2H_4$), acetylene ($C_2H_2$), fluorine ($F_2$), chlorine ($Cl_2$), etc.

In the case of using the starting material which is liquid at room temperature as the n-type dopant material, it is gasified beforehand by bubbling it using an inert gas such as Ar, He or $H_2$ gas as the carrier gas in the way as described for the p-type dopant. Further, in the case of using the inorganic lithium compound which is solid at room temperature, it is gasified beforehand by heat sublimation using Ar or He as the carrier gas in a heat sublimation furnace.

In the case of preparing a p-type $ZnSe_{1-x}Te_x$:H:M film by the method (1), it is more effective to introduce the dopant material together with the gaseous starting material B and the $H_2$ gas into the activation space.

In the case of preparing a $ZnSe_{1-x}Te_x$:H film or a p-type $ZnSe_{1-x}Te_x$:H:M film by either the method (1) or the method (2), the film-forming operation is conducted while controlling the substrate temperature to preferably 50 to 600° C., more preferably 50 to 500° C., and most suitably, 100 to 400° C. In any case, a deposition film in which crystal grains and amorphous grain domains being present together is generally obtained when the substrate temperature is in the range from 50 to 600° C. and, particularly, when conducting the film-forming operation while varying the amount of hydrogen radicals or the $H_2$ gas flow rate.

Then, as one of other film-forming conditions in the method (1) or (2), there can be mentioned the inner pressure upon forming the film. That is, it is desired for the inner pressure to be preferably at from $1 \times 10^{-4}$ to 50 Torr, more preferably from $5 \times 10^{-3}$ to 10 Torr and most preferably, from $1 \times 10^{-3}$ to 5 Torr. Further, the gaseous starting material A, the gaseous starting material B, the hydrogen gas and the gaseous p-type dopant material are introduced into the film-forming chamber at respective desired flow rates while being controlled by respective mass flow controllers so as to meet the predetermined conditions for preparing a desired film where the inside of the film-forming chamber is properly evacuated so as to maintain the inner pressure at a desired vacuum as described above.

In the method (1), the ratio of the total flow rate for the gaseous starting material A and the gaseous starting material B to be introduced into the film-forming chamber versus the amount of atomic hydrogen radicals is properly determined depending upon the kinds of the starting material A and the starting material B, as well as desired properties of a functional deposited film to be formed. In general, it is preferably from 1:10 to 1:10$^4$ and more preferably, from 1:25 to 1:10$^3$.

In the method (2), the ratio of the total flow rate for the gaseous starting material A and the gaseous starting material B versus the flow rate of the hydrogen gas is properly determined depending upon the correlations between the high frequency power to be applied, the inner pressure and the amount of hydrogen atom to be contained in a deposited film to be obtained. In general, it is preferably from 1:20 to $1:5\times 10^4$, and more preferably, from 1:30 to $1:5\times 10^3$.

Method (3)

As has been described above, this is a method of preparing a $ZnSe_{1-x}Te_x$:H film, a p- or an n-type $ZnSe_{1-x}Te_x$:H:M film by means of sputtering.

As the target, a polycrystalline $ZnSe_{1-x}Te_x$:H with a desired Se/Te quantitative ratio is typically used. In addition, two targets of ZnSe and ZnTe or three targets of Zn, Se and Te may be used. In a preferred embodiment upon sputtering the target by means of the high frequency power, sputtering is conducted in a gas atmosphere in which $H_2$ gas Ar gas and/or He gas are present in admixture.

When preparing a p-type or n-type $ZnSe_{1-x}Te_x$:H:M film by the method (3), sputtering is conducted while causing a predetermined amount of the gaseous p- or n-type dopant material as described for the method (1) or (2) to be present in admixture in the gas atmosphere and then conducting the film-forming process.

When forming a desired $ZnSe_{1-x}Te_x$:H film, p- or n-type $ZnSe_{1-x}Te_x$:H:M film by the method (3), the film-forming conditions concerning the distance between the target and the substrate, high frequency power, substrate temperature, inner pressure and the gas flow rate are important factors. At first, the distance between the target and the substrate is preferably from 20 to 100 mm, and most preferably, from 40 to 80 mm while somewhat different depending upon the structure and/or the scale of the apparatus to be used. For the high frequency power, it is preferably from 0.3 to 7 W/cm², and most preferably, from 0.8 to 4 W/cm² while different depending on the kind and/or the size of the target. The substrate temperature is set to the same temperature range as in the case of the method (1) or (2). Further, the inner pressure upon forming the film is preferably from $1\times 10^{-5}$ to $1\times 10^{-1}$ Torr, and most preferably, from $1\times 10^{-4}$ to $1\times 10^{-2}$ Torr. Further, as for the $H_2$ gas, the Ar gas and/or He gas, as well as the p-type dopant material, they are introduced into the film-forming chamber while being controlled by respective mass flow controllers such that they can satisfy predetermined film-forming conditions such that the gas atmosphere in the reaction space of the film-forming chamber may contain a predetermined amount of hydrogen atoms (H) or may contain both hydrogen atoms (H) and p- or n-type dopant (M) (that is H=M) in relation with the amounts of atomic Zn, Se and Te from the target by sputtering, and the inside of the film-forming chamber is evacuated so as to maintain the inner pressure as described above. That is, the ratio of the total amount of atomic Ze and atomic Se to be generated and the hydrogen atoms (H) or hydrogen atoms (H) and the dopant (M) (that is H=M) is preferably from $10^2$:1 to 1:$10^2$, more preferably from 10:1 to 1:$10^2$, and most preferably from 5:1 to 1:50.

Figure 3:
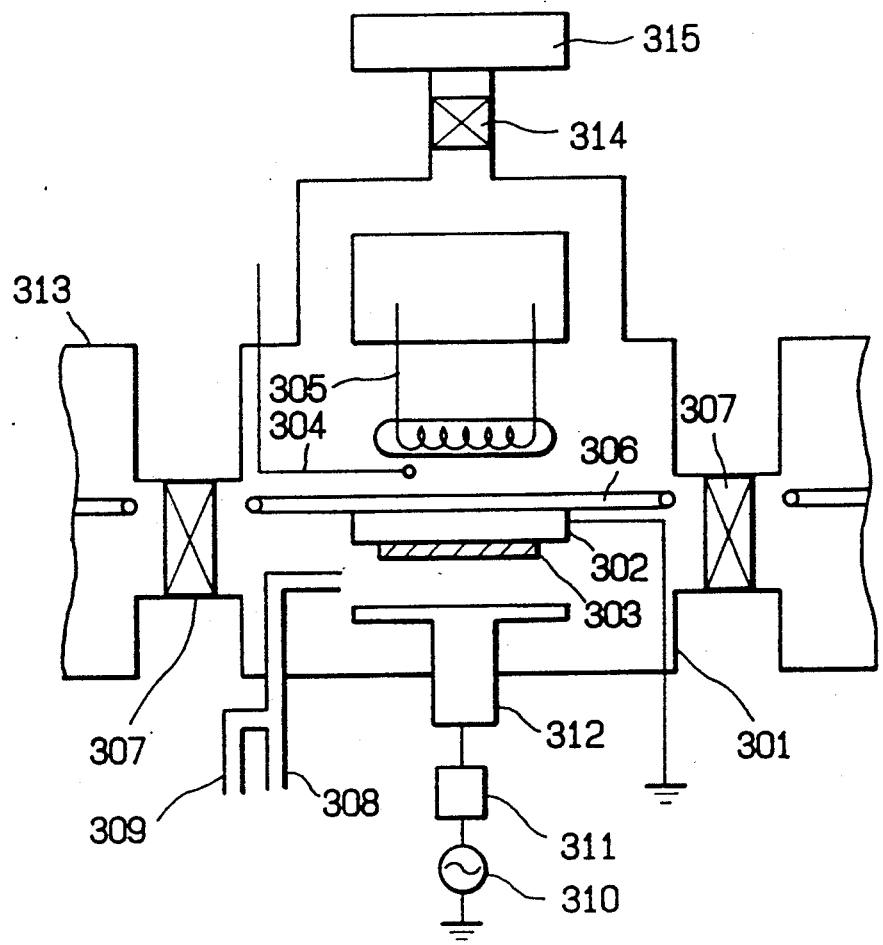
FIG. 3 is a schematic view for the embodiment of a deposited film forming apparatus for practicing the method (2) according to the present invention.
Figure 4:
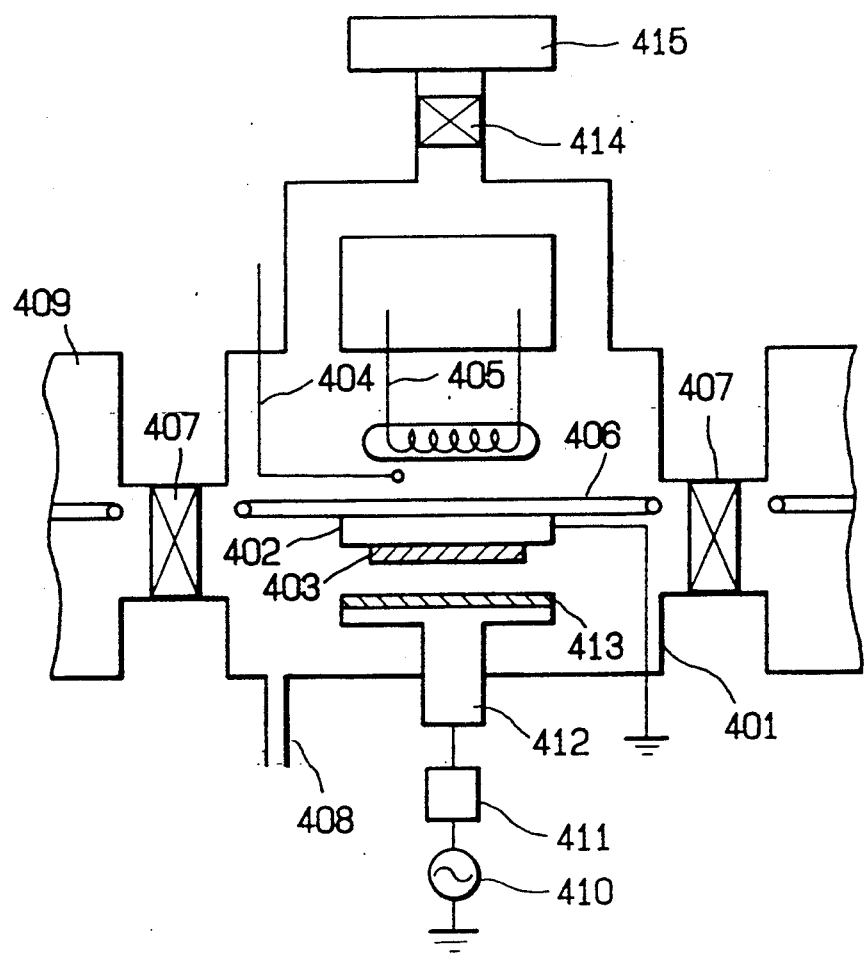
FIG. 4 is a schematic view for the embodiment of a deposited film forming apparatus for practicing the method (3) according to the present invention.

As has been described above, the method according to the present invention can be practiced by using an adequate apparatus such as shown in FIG. 2 through FIG. 4.

DESCRIPTION OF THE PREFERRED EMBODIMENTS

The functional deposited films according to the present invention and the method of the present invention are to be described specifically referring to examples using the illustrated apparatus.

FIG. 2 is a schematic view for a suitable embodiment of a deposited film-forming apparatus for practicing the method (1) according to the present invention. In FIG. 2, a substrate 203 is secured on a substrate cassette 202 placed in a film-forming chamber 201. The substrate 203 is monitored by a temperature monitor 204 and heated by radiation with an IR heater 205. The substrate cassette 202 is transferred by a substrate transfer device 206 through a gate valve 207 to another film-forming chamber 213 or a load lock chamber 212. Starting gas (A) is introduced from a gas introduction pipe (A) 208 into the film-forming chamber 201. Starting gas (B) and hydrogen gas are introduced from a gas introduction pipe (B) 209 and activated in an activation chamber 210 by activating means 211 and then introduced into the film-forming chamber 201. In this case, the activation means indicates those means for decomposing, polymerizing, radicalizing or ionizing the starting gas (A) and the starting gas (B) and the hydrogen gas by means of electrical energy such as DC current, radiowave, microwave, etc. light energy, heat energy, catalyst or like other means, for accelerating the reaction between the starting gas (A), starting gas (B) and hydrogen gas or reaction at the surface of the substrate.

In addition, gases in the film-forming chamber are evacuated by way of a valve 214 by an evacuation pump 215 so as to maintain the inside of the film-forming chamber to a predetermined pressure.

An example of preparing a $ZnSe_{1-x}Te_x$:H film according to the present invention using the apparatus shown in FIG. 2 is to be explained.

At first, a starting gas containing Se such as DESe, a starting gas containing Te such as DETe (starting gas B) and a hydrogen gas introduced from the gas introduction pipe 209 are activated by activating energy provided by the activating means 211 in the activating chamber 210 to form a Se-containing precursor, a Te-containing precursor and atomic hydrogen radicals.

Meanwhile, a starting gas (A) containing Zn such as DEZn introduced from another gas introduction pipe 208 is not previously excited by the activated means but introduced at the exit of the gas introduction pipe 208 into the film-forming chamber 201 since the exit from the gas introduction pipe 208 is at the downstream deviated from the activating chamber 210. In the film-forming chamber, the Zn-containing starting gas (A) causes chemical reaction with H radicals to form a Zn-containing precursor.

In this way, chemical reactions are taken place for the Se-containing precursor, the Te-containing precursor, the Zn-containing precursor and the hydrogen radicals introduced into the film-forming chamber to form a $ZnSe_{1-x}Te_x$:H film of a desired hydrogen content.

Further, it is considered that the hydrogen radicals contribute also to the film depositing reaction on the surface of the substrate, providing the effect of removing unnecessary alkyl groups from the deposited film and the effect as a terminator for embedding the dangling bonds in the $ZnSe_{1-x}Te_x$:H thin film and the radicals are incorporated in the film. Further it is also possible to bring the activating energy in the activating chamber into the film-forming chamber by the increase in the energy applied with the activating means, etc. as required for the reaction between the Zn-containing starting gas and hydrogen radicals, the reaction between the Zn-containing precursor and the Se-containing precursor and the reaction between the Zn-containing precursor and the Te-containing precursor, as well as for the increase of the amount of hydrogen radicals supplied in the reaction chamber. The amount of the hydrogen atoms (H) contained in the $ZnSe_{1-x}Te_x$:H film can be controlled by setting the flow rate of the hydrogen gas introduced as the starting gas, the amount of the activating energy applied, the pressure in the film-forming chamber, the distance between the gas exit of the gas introduction pipe 208 opened opposing to the film-forming chamber and the activating chamber 210 and the substrate temperature to desired values respectively.

The p-type control can be done by adding the dopant material described above to the starting material gas (A) or the starting material gas (B).

FIG. 3 is a schematic view for a preferred embodiment of the deposited film-forming apparatus for practicing the method (2) according to the present invention described above. In this apparatus, the starting gas (A) is introduced from a gas introduction pipe (A) 308, the starting gas (B) and the hydrogen gas are introduced from a gas introduction pipe (B) 309, mixed and then decomposed, polymerized, radicalized, ionized, etc. in plasmas formed by high frequency power applied from a high frequency power source 310 by way of circuit matching to a cathode 312 thereby causing reaction to deposit a $ZnSe_{1-x}Te_x$:H thin film on a substrate 303. Further, by flowing the dopant material additionally, p-doped deposited film can be obtained.

FIG. 4 is a schematic view for a preferred embodiment of the deposited film-forming apparatus for practicing the method (3) according to the present invention described above. In this apparatus, a $ZnSe_{1-x}Te_x$ polycrystalline target 413 of a desired Se/Te quantity ratio is appended on a cathode 412, and Ar gas and He gas are introduced through a gas introduction port 408 and the target 413 is sputtered by Ar ions and H ions formed in the plasmas formed by the high frequency power applied to the cathode and a $ZnSe_{1-x}Te_x$:H film is deposited on the substrate 403. Further, by admixing the dopant material described above with Ar and $H_2$ gas upon introduction, a p-doped deposited film can be obtained.

The advantages of this invention are now described in more detail by reference to the following Examples, which are provided merely for illustrative purposes only, and are not intended to limit the scope of this invention.

EXAMPLE 1

This example was carried out by using a deposited film forming apparatus shown in FIG. 2. The distance between the gas discharge port of the introduction pipe 208 and the activating chamber 210 was set to 80 mm.

At first, the quartz glass substrate 203 was set to the substrate cassette 202, which was transferred from the load lock chamber 212 through the gate valve 207 into the film-forming chamber by using the substrate transfer device 206 and a p-type $ZnSe_{1-x}Te_x$:H:M film and a non-doped $ZnSe_{1-x}Te_x$:H film was formed under the film-forming conditions shown in Table 5.

A non-doped $ZnSe_{1-x}Te_x$:H film was formed under the conditions shown in Table 5 except for not introducing $LiC_3H_7$ as the dopant material. A p-type $ZnSe_{1-x}Te_x$:H:Li film and non-doped $ZnSe_{1-x}Te_x$:H film of 1.0 $\mu$m and 0.9 $\mu$m thickness respectively were deposited in 30 minutes. Then, the substrate cassette 202 was transferred through the gate valve 207 to the load lock chamber 212 and taken out after cooling.

Then, they were placed in a separately disposed vacuum deposition chamber and comb-like Al electrodes (each 5 mm length and 200 $\mu$m gap width) were vapor-deposited by ohmic heating method to prepare specimens A-1 and A-2, for which dark conductivity $\sigma$d (S/cm) was measured under the application voltage of 10 V. Further, a specimen for measuring the proportion of the crystal grain domains under TEM observation and a specimen for measuring the H content and Se/Te quantitative ratio in the deposited film were prepared from respective portions of the thus obtained p-type $ZnSe_{1-x}Te_x$:H:Li film and the non-doped $ZnSe_{1-x}Te_x$:H film and they were evaluated respectively. The results of the evaluation are shown in Table 13.

EXAMPLE 2

This example was carried out by using the deposited film-forming apparatus shown in FIG. 3. At first, a quartz glass substrate 303 was set to a substrate cassette 302, transferred from a load lock chamber 313 through a gate valve 307 to the inside of a film-forming chamber 301 using a substrate transfer device 306. Then, a p-type $ZnSe_{1-x}Te_x$:H:Li film and a non-doped $ZnSe_{1-x}Te_x$:H film of about 1.0 $\mu$m and 0.9 $\mu$m thickness respectively were formed in 45 min under the film-forming conditions shown in Table 6.

The non-doped $ZnSe_{1-x}Te_x$:H was formed under the conditions shown in Table 6 except for not introducing $LiC_3H_7$ as the dopant material.

Then, the specimens B-1 and B-2 were prepared by the same procedures as in Example 1 and they were evaluated. The results of the evaluation are shown in Table 13.

EXAMPLE 3

This example was carried out by using the deposited film-forming apparatus shown in FIG. 4. At first, a quartz glass substrate 403 was set to a substrate cassette 402, transferred from a load lock chamber 416 through a gate valve 407 to the inside of a film-forming chamber 401 using a substrate transfer device 406. Then, a p-type $ZnSe_{1-x}Te_x$:H:Li film and a non-doped $ZnSe_{1-x}Te_x$:H film of about 1.0 $\mu$m thickness were formed in 50 min under the film-forming conditions shown in Table 7.

Then, specimens C-1 and C-2 were prepared by the same procedures as in Example 1 and they were evaluated. The results of the evaluation are shown in Table 13.

EXAMPLE 4

This example was carried out by using the deposited film-forming apparatus shown in FIG. 2. At first, a quartz glass substrate 203 was set to a substrate cassette 202, transferred from a load lock chamber 212 through a gate valve 207 to the inside of a film-forming chamber 201 using a substrate transfer device 206. Then, a p-type $ZnSe_{1-x}Te_x$:H:P film and a non-doped $ZnSe_{1-x}Te_x$:H film of about 1.0 $\mu$m thickness were formed respectively in 30 min under the film-forming conditions shown in Table 8.

The non-doped $ZnSe_{1-x}Te_x$:H film was formed under the conditions shown in Table 8 in the same film-forming conditions for the p-type film except for not introducing $PH_3$ as the dopant material. Then, specimens D-1 and D-2 were prepared by the same procedures as in Example 1 and they were evaluated. The results of the evaluation are shown in Table 13.

EXAMPLE 5

This example was carried out by using the deposited film forming apparatus shown in FIG. 2. The distance between the gas exit of the gas introduction pipe 208 and the activating chamber 210 was set to 80 mm.

At first, the quartz glass substrate 203 was set to the substrate cassette 202, transferred from the load lock chamber 212 through the gate valve 207 to the inside of the film-forming chamber 207 by using the substrate transfer device 206, and an n-type $ZnSe_{1-x}Te_x$:H film was formed under the film-forming conditions shown in Table 9.

An n- type $ZnSe_{1-x}Te_x$:H:Li film and a non-doped $ZnSe_{1-x}Te_x$:H film each of 1.1 um were deposited in 35 min. Then, the substrate cassette 202 was transferred through the gate value 207 to the load lock chamber 212 and taken out after cooling.

Then, they were placed in a vacuum deposition chamber disposed separately and a comb-like Al electrode (5 mm length, 250 um gap width) was vapor deposited by ohmic heating to prepare a specimen An-1 and the dark conductivity d (S/cm) was measured under the application voltage of 10 V. A specimen for measuring the proportion of the crystal grain domains by TEM observation and a specimen for measuring the H content and the Se/Te quantitative ratio in the deposited film were prepared from a portion of the obtained n-type $ZnSe_{1-x}Te_x$:H film and were evaluated respectively. The results of evaluation are shown in Table 13.

EXAMPLE 6

This example was carried out by using the deposited film-forming apparatus shown in FIG. 3. At first, the quartz glass substrate 303 was set to the substrate cassette 302, transferred from the load lock chamber 313 through the gate valve 307 to the inside of the film-forming chamber 301 using the substrate transfer device 306. Then, an n-type $ZnSe_{1-x}Te_x$:H:Al film of about 1.0 μm thickness was formed in 45 min under the film-forming conditions shown in Table 10.

Then, a specimen Bn-1 was prepared by the same procedures as in Example 1 and were evaluated. The results of the evaluation is shown in Table 13.

EXAMPLE 7

This example was carried out by using the deposited film-forming apparatus shown in FIG. 4. At first, the quartz glass substrate 403 was set to the substrate cassette 402, transferred from the load lock chamber 416 through the gate valve 407 to the inside of a film-forming chamber 401 using the substrate transfer device 406. Then, an n-type $ZnSe_{1-x}Te_x$:H:Al film of about 1.0 μm thickness was formed in 50 min under the film-forming conditions shown in Table 11.

Then, a specimen Cn-1 was prepared by the same procedures as in Example 1 and evaluated. The result of the evaluation is shown in Table 13.

EXAMPLE 8

This example was carried out by using the deposited film forming apparatus shown in FIG. 2. At first, the quartz glass substrate 203 was set to the substrate cassette 202, transferred from the load lock chamber 212 through the gate valve 207 to the inside of the film-forming chamber 201 using the substrate transfer device 206. Then, an n-type $ZnSe_{1-x}Te_x$:H:Ga film of about 1.0 μm thickness was formed in 30 min under the film-forming conditions shown in Table 12.

Then, a specimen Dn-1 was prepared by the same procedures as in Example 1 and evaluated. The results of the evaluation are shown in Table 13.

COMPARATIVE EXAMPLE 1

An Li-doped specimen E-1 and a non-doped specimen E-2 for comparison were prepared by using the same substrate, film-forming apparatus, film-forming conditions and electrode structure as those in Example 3 under the same film-forming conditions used in Example 3 (Table 7) except for not introducing $H_2$ gas, and they were evaluated. The results of the evaluation are shown in Table 13.

COMPARATIVE EXAMPLE 2

Specimens F-1 and F-2 for comparison were prepared using the same substrate, film-forming conditions and film-forming apparatus as those in Example 1 under the film-conditions used in Example 1 (Table 5) except for changing the DESe flow rate to $7.5 \times 10^{-6}$ mol/min and DETe flow rate to $5.0 \times 10^{-6}$ mol/min for the starting gas (B) and they were evaluated. The results of the evaluation are shown in Table 13.

Properties for each of the specimens in Example 1 through 8 and Comparative Examples 1 and 2 are collectively shown in the Table 13 below. Further, the conduction type was evaluated by the measurement of the thermoelectromotive force. Further, the proportion of the crystal grain domains in the film was measured by the observation for TEM transmission images of the $ZnSe_{1-x}Te_x$:H film and the p-type, n-type $ZnSe_{1-x}Te_x$:H:M films formed on $SiO_2$ formed by thermal oxidization on Si wafers set in the film-forming chamber together with the quartz substrate upon film-formation.

COMPARATIVE EXAMPLE 3

Comparative specimens were prepared by using the same substrate, film-forming conditions and film-forming apparatus as those for manufacturing the p-type doped films under the film-conditions practiced in Example 1 (Table 5) except for changing the flow rates of $H_2$ gas introduced together with the starting gas (B). The film-forming conditions and the result of the evaluation are shown in Table 14.

From the result above, in Examples 1-4, the obtained non-doped $ZnSe_{1-x}Te_x$:H film showed weak p-type conduction, the $ZnSe_{1-x}Te_x$:H:Li film and $ZnSe_{1-x}Te_x$:H:P film introduced with p-type dopant showed p-type conduction and the $ZnSe_{1-x}Te_x$:H:Al film and the $ZnSe_{1-x}Te_x$:H:Ga film introduced with n-type dopant showed n-type conduction and satisfactory control for the conduction type could be obtained. The content of hydrogen atoms in the film and the proportion of the crystal grain domains per unit volume in the film were controlled to those values specified by the present invention.

On the other hand, the ZnSe$_{1-x}$Te$_x$ film (x=0.2) was formed by the used sputtering method in Comparative Examples, but both of the film introduced with p-type dopant and the non-doped film show weak p-type conduction. In addition, the content of hydrogen atoms in both of the films were significantly lower than the value specified in the present invention and judgment for the crystal grain region was also difficult.

In summary, it has been confirmed that if the Se/Te quantity ratio in the film is within a range from 3:7 to 1:9 could be controlled stably and easily and at high purity, by positively using H$_2$ gas and controlling the content of hydrogen atoms in the film and the proportion of the crystal grain domains per unit volume to specific ranges, for the ZnSe$_{1-x}$Te$_x$ films for which p-type doping was impossible by the conventional method shown in the Comparative Examples.

EXAMPLE 9

A pn type photovoltatic device was prepared by laminating quartz glass as a substrate, a thin Ag film as a lower electrode, an n-type ZnSe$_{1-x}$Te$_x$:H:Al film prepared in the same manner as the specimen An-1 as the n-type semiconductor layer, a p-type ZnSe$_{1-x}$Te$_x$:H:Li film prepared in the same manner as the specimen A-1 as the p-type semiconductor layer, a thin ITO film prepared by sputtering as the upper electrode and a thin Al film as the collector electrode in this order.

When the photovoltaic characteristics were measured for the photovoltaic device by the usual method, it showed extremely satisfactory photovoltaic characteristics, that is, high optoelectronic conversion ratio and satisfactory open voltage characteristics.

TABLE 1

| | |
|---|---|
| substrate temperature | 200° C. |
| raw material gas (A) | DEZn: 10 × 10$^{-6}$ mol/min |
| | He: 10 sccm |
| raw material gas (B) | DESe: 3.0 × 10$^{-6}$ mol/min |
| | DETe: 8.0 × 10$^{-6}$ mol/min |
| | He: 15 sccm |
| | H$_2$*: 1.5 sccm ~ 1 slm |
| inner pressure | 0.5 Torr |
| power of activation energy | 200 W (microwave: 2.45 GHz) |
| distance between activation chamber and liberation opening for gas from gas feed pipe | 5 cm |

*flow rate of the H$_2$ gas

| Sample No. | |
|---|---|
| No. 1 | 0.1 sccm |
| No. 2 | 0.3 sccm |
| No. 3 | 1 sccm |
| No. 4 | 3 sccm |
| No. 5 | 5 sccm |
| No. 6 | 10 sccm |
| No. 7 | 15 sccm |
| No. 8 | 20 sccm |
| No. 9 | 30 sccm |
| No. 10 | 100 sccm |
| No. 11 | 300 sccm |
| No. 12 | 1 slm |

TABLE 2

| Sample No. | composition (atomic %) | | |
|---|---|---|---|
| | Zn | Se | Te |
| 1 | 48 | 10 | 42 |
| 2 | 52 | 9 | 39 |
| 3 | 50 | 11 | 39 |
| 4 | 47 | 11 | 42 |
| 5 | 54 | 10 | 36 |
| 6 | 53 | 9 | 37 |
| 7 | 52 | 9 | 39 |
| 8 | 53 | 10 | 37 |
| 9 | 52 | 10 | 38 |
| 10 | 49 | 11 | 40 |
| 11 | 53 | 9 | 38 |
| 12 | 51 | 10 | 39 |

TABLE 3

| | |
|---|---|
| substrate temperature | 200° C. |
| raw material gas (A) | DEZn: 1.0 × 10$^{-6}$ mol/min |
| | He: 10 sccm |
| | LiC$_3$H$_7$: 1.0 × 10$^{-10}$ mol/min |
| raw material gas (B) | DESe**: 0~1.5 × 10$^{-5}$ mol/min |
| | DETe**: 0~1.0 × 10$^{-5}$ mol/min |
| | He: 15 sccm |
| | H$_2$*: 1.5 sccm ~ 1 slm |
| inner pressure | 0.5 Torr |
| power of activation energy | 200 W (microwave: 2.45 GHz) |
| distance between activation chamber and liberation opening for gas from gas feed pipe | 5 cm |

*flow rate of the H$_2$ gas

| sample | |
|---|---|
| No. 1-N | 0.1 sccm |
| No. 2-N | 0.3 sccm |
| No. 3-N | 1 sccm |
| No. 4-N | 3 sccm |
| No. 5-N | 5 sccm |
| No. 6-N | 10 sccm |
| No. 7-N | 15 sccm |
| No. 8-N | 20 sccm |
| No. 9-N | 30 sccm |
| No. 10-N | 100 sccm |
| No. 11-N | 300 sccm |
| No. 12-N | 1 slm |

**adjustments of the amounts of DESe and DETe to be introduced were made by changing respective set temperatures of the corresponding bubblers

| sample No. | DESe (mol/min) | DETe (mol/min) |
|---|---|---|
| L-1 | 1.5 × 10$^{-5}$ | 0 |
| L-2 | 1.35 × 10$^{-5}$ | 1 × 10$^{-6}$ |
| L-3 | 1.2 × 10$^{-5}$ | 1 × 10$^{-6}$ |
| L-4 | 1.05 × 10$^{-5}$ | 1 × 10$^{-6}$ |
| L-5 | 9.0 × 10$^{-6}$ | 1 × 10$^{-6}$ |
| L-6 | 7.5 × 10$^{-6}$ | 1 × 10$^{-6}$ |
| L-7 | 6.0 × 10$^{-6}$ | 1 × 10$^{-6}$ |
| L-8 | 4.5 × 10$^{-6}$ | 1 × 10$^{-6}$ |
| L-9 | 3.0 × 10$^{-6}$ | 1 × 10$^{-6}$ |
| L-10 | 1.5 × 10$^{-6}$ | 1 × 10$^{-6}$ |
| L-11 | 0 | 1 × 10$^{-5}$ |

TABLE 4

| | |
|---|---|
| substrate temperature | 200° C. |
| raw material gas (A) | DEZn: 10 × 10$^{-6}$ mol/min |
| | He: 10 sccm |
| doping raw material: | |
| | TMG$_a$: 5 × 10$^{-11}$ mol/min |
| | or |
| | LiC$_3$H$_7$: 1.0 × 10$^{-10}$ mol/min |
| raw material gas (B) | DESe: 0~1.2 × 10$^{-5}$ mol/min |
| | DETe: 0~1.0 × 10$^{-5}$ mol/min |
| | He: 15 sccm |
| | H$_2$: 15 sccm |
| inner pressure | 0.5 Torr |
| power of activation energy | 200 W (microwave: 2.45 GHz) |
| distance between activation chamber and liberation opening for gas from gas feed pipe | 5 cm |

TABLE 5

| | |
|---|---|
| substrate temperature | 200° C. |
| raw material gas (A) | DEZn: $1.0 \times 10^{-6}$ mol/min |
| | He: 10 sccm |
| doping raw material | $LiC_3H_7$: $1.0 \times 10^{-10}$ mol/min |
| raw material gas (B) | DESe: $3.0 \times 10^{-6}$ mol/min |
| | DETe: $8.0 \times 10^{-6}$ mol/min |
| | He: 15 sccm |
| | $H_2$: 15 sccm |
| inner pressure | 0.5 Torr |
| power of activation energy | 200 W (microwave: 2.45 GHz) |

TABLE 6

| | |
|---|---|
| substrate temperature | 300° C. |
| raw material gas (A) | DESe: $3.0 \times 10^{-6}$ mol/min |
| | DETe: $8.0 \times 10^{-6}$ mol/min |
| raw material gas (B) | DEZn: $1.2 \times 10^{-6}$ mol/min |
| | Ar: 50 sccm |
| | $H_2$: 50 sccm |
| | $LiC_3H_7$: $1.0 \times 10^{-10}$ mol/min |
| power of activation energy | 50 W (high frequency: 13.56 MHz) |

TABLE 7

| | |
|---|---|
| target material | polycrystal $ZnSe_{0.2}Te_{0.8}$ |
| substrate temperature | 300° C. |
| flow rate of Ar | 10 sccm |
| flow rate of $LiC_3H_7$ | $1.3 \times 10^{-10}$ mol/min |
| flow rate of $H_2$ | 10 sccm |
| inner pressure | 0.05 Torr |
| power of activation energy | 300 W (high frequency: 13.56 MHz) |

TABLE 8

| | |
|---|---|
| substrate temperature | 200° C. |
| raw material gas (A) | DEZn: $1.2 \times 10^{-6}$ mol/min |
| | Ar: 10 sccm |
| raw material gas (B) | DESe: $3.0 \times 10^{-6}$ mol/min |
| | DETe: $8.0 \times 10^{-6}$ mol/min |
| | Ar: 15 sccm |
| | He: 15 sccm |
| | $H_2$: 0.15 sccm |
| | ($PH_3/H_2$ = 1%) |
| inner pressure | 0.5 Torr |
| power of activation energy | 200 W (microwave: 2.45 GHz) |

TABLE 9

| | |
|---|---|
| substrate temperature | 200° C. |
| raw material gas (A) | DEZn: $1.0 \times 10^{-6}$ mol/min |
| | He: 10 sccm |
| doping raw material: | $Al(CH_3)_3$: $7 \times 10^{-11}$ mol/min |
| raw material gas (B) | DESe: $3.0 \times 10^{-6}$ mol/min |
| | DETe: $8.0 \times 10^{-6}$ mol/min |
| | He: 15 sccm |
| | $H_2$: 15 sccm |
| inner pressure | 0.5 Torr |
| power of activation energy | 200 W (microwave: 2.45 GHz) |

TABLE 10

| | |
|---|---|
| substrate temperature | 300° C. |
| raw material gas (A) | DESe: $3.0 \times 10^{-6}$ mol/min |
| | DETe: $8.0 \times 10^{-6}$ mol/min |
| raw material gas (B) | DEZn: $1.2 \times 10^{-6}$ mol/min |
| | Ar: 50 sccm |
| | $H_2$: 50 sccm |
| | $Al(CH_3)_3$: $1.0 \times 10^{-10}$ mol/min |
| power of activation energy | 50 W (high frequency: 13.56 MHz) |

TABLE 11

| | |
|---|---|
| target material | polycrystal $ZnSe_{0.2}Te_{0.8}$ |
| substrate temperature | 300° C. |
| flow rate of Ar | 10 sccm |
| flow rate of $Al(CH_3)_3$ | $1.3 \times 10^{-10}$ mol/min |
| flow rate of $H_2$ | 10 sccm |
| inner pressure | 0.05 Torr |
| power of activation energy | 300 W (high frequency: 13.56 MHz) |

TABLE 12

| | |
|---|---|
| substrate temperature | 200° C. |
| raw material gas (A) | DEZn: $1.2 \times 10^{-6}$ mol/min |
| | Ar: 10 sccm |
| raw material gas (B) | DESe: $3.0 \times 10^{-6}$ mol/min |
| | DETe: $8.0 \times 10^{-6}$ mol/min |
| | Ar: 15 sccm |
| | $H_2$: 15 sccm |
| | $Ga(CH)_3$: 0.15 sccm |
| inner pressure | 0.5 Torr |
| power of activation energy | 200 W (microwave: 2.45 GHz) |

TABLE 13

| Sample NO. | $\sigma d$(S/cm) | Conduction type | hydrogen (H) content in film | volume percentage of crystal grain domain in film | quantitative ratio of Se to Te in film (ratio for the number of atoms) |
|---|---|---|---|---|---|
| A-1 | $3 \times 10^{-3}$ | p-type | 2.1 | 76 | 2.3:7.7 |
| A-2 | $8 \times 10^{-10}$ | p-type$_{(w)}$ | 2.5 | 81 | 2.2:7.8 |
| B-1 | $5 \times 10^{-4}$ | p-type | 2.8 | 66 | 2.1:7.9 |
| B-2 | $4 \times 10^{-10}$ | p-type$_{(w)}$ | 2.9 | 70 | 2.2:7.8 |
| C-1 | $2 \times 10^{-4}$ | p-type | 2.1 | 73 | 2.0:8.0 |
| C-2 | $9 \times 10^{-11}$ | p-type$_{(w)}$ | 2.6 | 68 | 2.1:7.9 |
| D-1 | $7 \times 10^{-3}$ | p-type | 2.4 | 74 | 2.1:7.9 |
| D-2 | $3 \times 10^{-10}$ | p-type$_{(w)}$ | 2.5 | 81 | 2.0:8.0 |
| $A_n$-1 | $2 \times 10^{-1}$ | n-type | 2.3 | 80 | 2.0:8.0 |
| $B_n$-1 | $1 \times 10^{-2}$ | n-type | 3.2 | 69 | 1.9:8.1 |
| $C_n$-1 | $4 \times 10^{-3}$ | n-type | 2.0 | 83 | 1.8:8.2 |
| $D_n$-1 | $3 \times 10^{-1}$ | n-type | 3.3 | 72 | 1.9:8.1 |
| E-1 | $3 \times 10^{-11}$ | p-type$_{(w)}$ | 0.005 | impossible to determine | 2.0:8.0 |
| E-2 | $2 \times 10^{-12}$ | p-type$_{(w)}$ | 0.002 | | |
| F-1 | $1 \times 10^{-5}$ | p-type$_{(w)}$ | 2.3 | 48 | 5.1:4.9 |

TABLE 13-continued

| Sample NO. | $\sigma d$(S/cm) | Conduction type | hydrogen (H) content in film | volume percentage of crystal grain domain in film | quantitative ratio of Se to Te in film (ratio for the number of atoms) |
|---|---|---|---|---|---|
| F-2 | $4 \times 10^{-10}$ | n-type$_{(w)}$ | 2.4 | 76 | 5.0:5.0 |

Notes
(1) p-type$_{(w)}$: stands for weak p-type, n-type$_{(w)}$: stands for weak n-type.
(2) even after irradiation of AM-1.5 (100 mw/cm$^2$) for 8 hours, any change was not observed on the $\sigma d$ value for any of the samples.

TABLE 14

| sample No. | flow rate | | |
|---|---|---|---|
| | G | H | I |
| raw material gas (A): | | | |
| DEZn | $1.0 \times 10^{-6}$ mol/min | | |
| He | 10 sccm | | |
| LiC$_3$H$_7$ | $1 \times 10^{-9}$ mol/min | | |
| raw material gas (B): | | | |
| DESe | $3 \times 10^{-6}$ mol/min | | |
| DETe | $8 \times 10^{-6}$ mol/min | | |
| He | 15 sccm | | |
| H$_2$ | 1 sccm | 3 sccm | 200 sccm |
| measured results | | | |
| $\sigma d$(S/cm) | $3 \times 10^{-7}$ | $9 \times 10^{-5}$ | $2 \times 10^{-4}$ |
| | ($3 \times 10^{-7}$) | ($9 \times 10^{-5}$) | ($1 \times 10^{-6}$) |
| conduction type | p-type | p-type | p-type |
| hydrogen (H) content in film (atomic/%) | 0.25 | 0.6 | 20 |
| volume percentage of crystal grain domain in film (vol. %) | 88 | 86 | 30 |
| quantitative ratio of Se to Te in film (ratio for number of atoms) | Se:Te = 2.1:7.9 | Se:Te = 2.2:7.8 | Se:Te = 2.0:8.0 |

Note:
the $\sigma d$ values mentioned in the parentheses are those observed after irradiation of AM-1.5 (100 mw/cm$^2$) for 8 hours

What we claim is:

1. A functional deposited film on a substrate, said film comprising zinc atoms, selenium atoms, tellurium atoms and at least hydrogen atoms, characterized in that the quantitative ratio of said selenium atoms to said tellurium atoms is in the range from 1:9 to 3:7 by the atom number ratio: said hydrogen atoms are contained in an amount of 1 to 4 atomic %: and crystal grain domains are contained in a proportion per unit volume of 65 to 85% by volume.

2. The functional deposited film according to claim 1 which has p-type semiconductive characteristics.

3. The functional deposited film according to claim 2 which contains a member selected from the group consisting of Group I elements and Group V elements of the Periodic Table.

4. The functional deposited film according to claim 3, wherein said member is lithium.

* * * * *

UNITED STATES PATENT AND TRADEMARK OFFICE
CERTIFICATE OF CORRECTION

PATENT NO. : 5,028,488

DATED : July 2, 1991

INVENTOR(S) : KATSUMI NAKAGAWA ET AL.

It is certified that error appears in the above-identified patent and that said Letters Patent is hereby corrected as shown below:

TITLE PAGE,

AT [75] INVENTORS

"Yasushi Fujioka, Sakai; Akira, both of Nagahama," should read --Yasushi Fujioka, Akira Sakai, both of Nagahama,--.

AT [56] REFERENCES CITED

U.S. Patent Documents, "Sanpregret" should read --Sansregret--.

AT 57] ABSTRACT

Line 1, "A functional" should read --An improved functional--.

SHEET 6 OF 15

Figure 6:
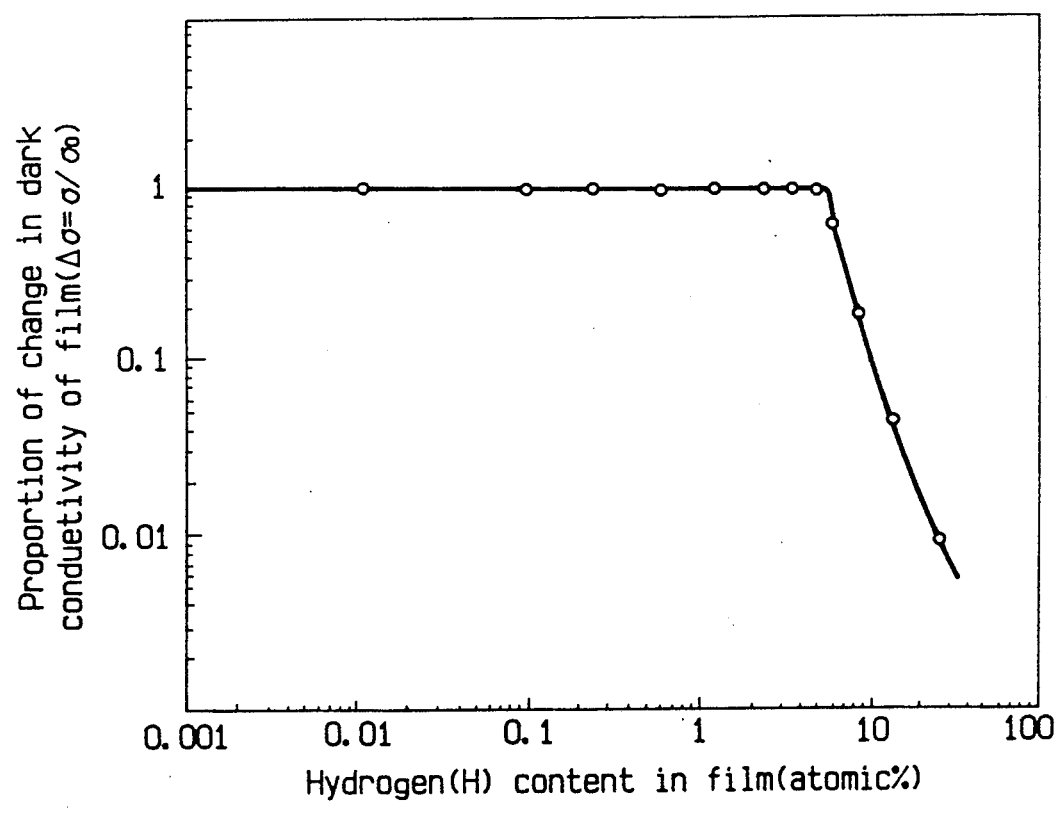
FIG. 6 is an explanatory view illustrating relationship between the hydrogen (H) content in the film and the variation ratio of the conductivity in Experiment B in the present invention.

FIG. 6, "CONDUETIVITY" should read --CONDUCTIVITY--.

COLUMN 2

Line 13, "that" should read --that it--.

COLUMN 3

Line 23, "which" should read --which we--.

COLUMN 4

Line 15, "ration" should read --ratio--.

UNITED STATES PATENT AND TRADEMARK OFFICE
CERTIFICATE OF CORRECTION

PATENT NO. : 5,028,488
DATED : July 2, 1991
INVENTOR(S) : KATSUMI NAKAGAWA ET AL.

It is certified that error appears in the above-identified patent and that said Letters Patent is hereby corrected as shown below:

COLUMN 9

Line 64, "$ZnSe_{1-z}Te_x$:H film" should read --$ZnSe_{1-x}Te_x$:H film--.

COLUMN 10

Line 1, "$ZnSe_{1-z}Te_x$:H film" should read --$ZnSe_{1-x}Te_x$:H film--.
Line 2, "$ZnSe_{1-z}Te_x$:H:Li film" should read --$ZnSe_{1-x}Te_x$:H:Li film--.
Line 28, "$ZnSe_{1-z}Te_x$ films" should read --$ZnSe_{1-x}Te_x$ films--.
Line 38, "$ZnSe_{1-z}Te_x$:H film" should read --$ZnSe_{1-x}Te_x$:H film--.

COLUMN 11

Line 6, "$ZnSe_{1-z}Te_x$ film" should read --$ZnSe_{1-x}Te_x$ film--.
Line 19, "$ZnSe_{1-z}Te_x$:H:Li" should read --$ZnSe_{1-x}Te_x$:H:Li--.
Line 46, "$ZnSe_{1-z}Te_x$ films" should read --$ZnSe_{1-x}Te_x$ films--.
Line 50, "$ZnSe_{1-z}Te_x$ films" should read --$ZnSe_{1-x}Te_x$ films--.

UNITED STATES PATENT AND TRADEMARK OFFICE
CERTIFICATE OF CORRECTION

PATENT NO. : 5,028,488

DATED : July 2, 1991

INVENTOR(S) : KATSUMI NAKAGAWA ET AL.

It is certified that error appears in the above-identified patent and that said Letters Patent is hereby corrected as shown below:

COLUMN 12

Line 7, "$ZnSe_{1-z}Te_x:H:Ga$ films," should read --$ZnSe_{1-x}Te_x:H:Ga$ films,--.

Line 17, "$ZnSe_{1-z}Te_x:H:Li$" should read --$ZnSe_{1-x}Te_x:H:Li$--.

Line 25, "see" should read --seen--.

Line 30, "$ZnSe_{1-z}Te_x:H$ film" should read --$ZnSe_{1-x}Te_x:H$ film--.

Line 33, "$ZnSe_{1-z}Te_x:H$ films" should read --$ZnSe_{1-x}Te_x:H$ films--.

Line 64, "$ZnSe_{1-z}Te_x:H$ film" should read --$ZnSe_{1-x}Te_x:H$ film--.

COLUMN 13

Line 2, "to" should read --to be-- and "$ZnSe_{1-z}Te_x:H$ film" should read --$ZnSe_{1-x}Te_x:H$ film--.

Line 3, "$ZnSe_{1-z}Te_x:H:M$ film" should read --$ZnSe_{1-x}Te_x:H:M$ film--.

Line 11, "$ZnSe_{1-z}Te_x:H$ films" should read --$ZnSe_{1-x}Te_x:H$ films--.

Line 16, "$ZnSe_{1-z}Te_x:H$ film," should read --$ZnSe_{1-x}Te_x:H$ film,--.

Line 17, "$ZnSe_{1-z}Te_x:H$ film." should read --$ZnSe_{1-x}Te_x:H$ film.--.

Line 19, "$ZnSe_{1-z}Te_x:H$ film." should read --$ZnSe_{1-x}Te_x:H$ film.--.

Line 22, "$ZnSe_{1-z}Te_x:H:M$" should read --$ZnSe_{1-x}Te_x:H:M$--.

Line 48, "observed" should read --observed to--.

Line 62, "$ZnSe_{1-z}Te_x:H$" should read --$ZnSe_{1-x}Te_x:H$--.

UNITED STATES PATENT AND TRADEMARK OFFICE
CERTIFICATE OF CORRECTION

PATENT NO. : 5,028,488

DATED : July 2, 1991

INVENTOR(S) : KATSUMI NAKAGAWA ET AL.

It is certified that error appears in the above-identified patent and that said Letters Patent is hereby corrected as shown below:

COLUMN 14

Line 3, "$_zTe_x$:H:M" should read --"$_xTe_x$:H:M--.
Line 12, "$ZnSe_{1-z}Te_x$:H film" should read --$ZnSe_{1-x}Te_x$:H film--.
Line 30, "$ZnSe_{1-z}Te_x$:H film" should read --$ZnSe_{1-x}Te_x$:H film--.
Line 40, "$ZnSe_{1-z}Te_x$:H film" should read --$ZnSe_{1-x}Te_x$:H film--.
Line 44, "$ZnSe_{1-z}Te_x$:H:Mp film" should read --$ZnSe_{1-x}Te_x$:H:Mp film--.
Line 50, "$ZnSe_{1-z}Te_x$:H:Mp film" should read --$ZnSe_{1-x}Te_x$:H:Mp film--.

COLUMN 15

Line 33, "$ZnSe_{1-z}Te_x$:H film" should read --$ZnSe_{1-x}Te_x$:H film--.
Line 64, "$ZnSe_{1-z}Te_x$:H film." should read --$ZnSe_{1-x}Te_x$:H film.--.

COLUMN 16

Line 7, "what" should read --what is--.
Line 41, "tative" should read --taic--.

COLUMN 17

Line 9, "CaF , BaF ," should read --$CaF_2$, $BaF_2$,--.
Line 19, "photovoltatic" should read --photovoltaic--.
Line 20, "photovoltatic" should read --photovoltaic--.
Line 57, "photovoltatic" should read --photovoltaic--.

UNITED STATES PATENT AND TRADEMARK OFFICE
CERTIFICATE OF CORRECTION

PATENT NO. : 5,028,488
DATED : July 2, 1991
INVENTOR(S) : KATSUMI NAKAGAWA ET AL.

It is certified that error appears in the above-identified patent and that said Letters Patent is hereby corrected as shown below:

COLUMN 20

Line 12, "$(B_{2H}6),$" should read --$(B_2H_6),$--.
Line 14, "ethane $C_2H_6$)," should read --ethane $(C_2H_6),$--.

COLUMN 21

Line 18, "$H_2$ gas" should read --$H_2$ gas,--.
Line 54, "H=M)" should read --H+M)--.
Line 61, "H=M)" should read --H+M)--.

COLUMN 24

Line 35, "$ZnSe_{1-x}Te_x:H$" should read --$ZnSe_{1-x}Te_x:H$ film--.

COLUMN 25

Line 29, "250 um" should read --250 µm--.

UNITED STATES PATENT AND TRADEMARK OFFICE
CERTIFICATE OF CORRECTION

PATENT NO. : 5,028,488

DATED : July 2, 1991

INVENTOR(S) : KATSUMI NAKAGAWA ET AL.

It is certified that error appears in the above-identified patent and that said Letters Patent is hereby corrected as shown below:

COLUMN 27

Line 10, "1:9" should read --1:9 as carried out in Examples 1 through 8, conduction type--.
Line 20, "photovoltatic" should read --photovoltaic--.
Line 29, "photovoltatic" should read --photovoltaic--.
Line 30, "photovoltatic" should read --photovoltaic--.
Line 31, "photovoltatic" should read --photovoltaic--.

Signed and Sealed this

Seventh Day of April, 1992

Attest:

HARRY F. MANBECK, JR.

*Attesting Officer*  *Commissioner of Patents and Trademarks*